(12) United States Patent
Song et al.

(10) Patent No.: US 10,529,817 B2
(45) Date of Patent: Jan. 7, 2020

(54) SEMICONDUCTOR DEVICES HAVING MULTI-THRESHOLD VOLTAGE

(71) Applicant: Samsung Electronics Co., Ltd., Suwon-si, Gyeonggi-do (KR)

(72) Inventors: Jae-yeol Song, Seoul (KR); Wan-don Kim, Seongnam-si (KR); Su-young Bae, Daegu (KR); Dong-soo Lee, Gunpo-si (KR); Jong-han Lee, Namyangju-si (KR); Hyung-suk Jung, Suwon-si (KR); Sang-jin Hyun, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/042,114

(22) Filed: Jul. 23, 2018

(65) Prior Publication Data
US 2019/0189767 A1    Jun. 20, 2019

(30) Foreign Application Priority Data
Dec. 19, 2017    (KR) .......................... 10-2017-0175340

(51) Int. Cl.
*H01L 29/49*    (2006.01)
*H01L 29/423*    (2006.01)
(Continued)

(52) U.S. Cl.
CPC .... *H01L 29/4966* (2013.01); *H01L 21/82345* (2013.01); *H01L 21/823462* (2013.01);
(Continued)

(58) Field of Classification Search
CPC ............. H01L 29/4966; H01L 29/4238; H01L 29/42364; H01L 29/571; H01L 21/82345; H01L 21/823462
(Continued)

(56) References Cited

U.S. PATENT DOCUMENTS

| 8,357,604 B2 | 1/2013 | Hoentschel et al. |
| 8,753,936 B2 | 6/2014 | Chudzik et al. |

(Continued)

FOREIGN PATENT DOCUMENTS

KR    10-2016-0095399 A    8/2016

*Primary Examiner* — Dao H Nguyen
(74) *Attorney, Agent, or Firm* — Harness, Dickey & Pierce, P.L.C.

(57) ABSTRACT

A semiconductor device includes active regions on a semiconductor substrate, gate structures on separate, respective active regions, and source/drain regions in the semiconductor substrate on opposite sides of separate, respective gate structures. Each separate gate structure includes a sequential stack of a high dielectric layer, a first work function metal layer, a second work function metal layer having a lower work function than the first work function metal layer, and a gate metal layer. First work function metal layers of the gate structures have different thicknesses, such that the gate structures include a largest gate structure where the first work function metal layer of the largest gate structure has a largest thickness of the first work function metal layers. The largest gate structure includes a capping layer on the high dielectric layer of the largest gate structure, where the capping layer includes one or more impurity elements.

20 Claims, 26 Drawing Sheets

(51) Int. Cl.
*H01L 21/8234* (2006.01)
*H01L 29/51* (2006.01)

(52) U.S. Cl.
CPC .... *H01L 29/4238* (2013.01); *H01L 29/42364* (2013.01); *H01L 29/517* (2013.01)

(58) Field of Classification Search
USPC ........ 257/411, 412, 336, 369, 392, E29.256, 257/E27.06, E27.062, E21.19, E21.625, 257/E21.637; 438/589, 587, 592, 275, 438/199
See application file for complete search history.

(56) References Cited

U.S. PATENT DOCUMENTS

| | | | |
|---|---|---|---|
| 9,018,710 B2 | 4/2015 | Lee et al. | |
| 9,219,125 B2 * | 12/2015 | Chen | H01L 29/78 |
| 9,219,155 B2 | 12/2015 | Steigerwald et al. | |
| 9,281,310 B2 | 3/2016 | Ji et al. | |
| 9,362,180 B2 | 6/2016 | Lee et al. | |
| 9,455,201 B2 | 9/2016 | Joshi et al. | |
| 9,461,132 B2 | 10/2016 | Cheon et al. | |
| 9,502,416 B1 | 11/2016 | Kim | |
| 9,530,778 B1 * | 12/2016 | Lin | H01L 27/0922 |
| 9,685,520 B1 | 6/2017 | Hsu et al. | |
| 10,181,427 B2 * | 1/2019 | Song | H01L 27/0605 |
| 2016/0225868 A1 * | 8/2016 | Kim | H01L 29/4966 |
| 2016/0276224 A1 * | 9/2016 | Gan | H01L 21/823842 |
| 2017/0005175 A1 | 1/2017 | Song et al. | |
| 2017/0309520 A1 * | 10/2017 | Liou | H01L 21/823456 |

* cited by examiner

SEMICONDUCTOR DEVICES HAVING MULTI-THRESHOLD VOLTAGE

CROSS-REFERENCE TO RELATED APPLICATION

This application claims the benefit, under 35 U.S.C. § 119, of Korean Patent Application No. 10-2017-0175340, filed on Dec. 19, 2017, in the Korean Intellectual Property Office, the disclosure of which is incorporated herein in its entirety by reference.

BACKGROUND

The inventive concepts relate to semiconductor devices, and more particularly, to semiconductor device having a multi-threshold voltage.

A semiconductor device may include a plurality of metal-oxide semiconductor (MOS) transistors having a plurality of threshold voltages, that is, a multi-threshold voltage, in order to be configured to perform various functions. Manufacturing semiconductor devices having a multi-threshold voltage may include reliably forming a plurality of gate structures having different work functions on a substrate without affecting a manufacturing process.

SUMMARY

The inventive concepts may provide a semiconductor device that includes gate structures having different work functions, the gate structures reliably provided ("formed") without affecting the influence of manufacturing processes, to thereby have a multi-threshold voltage.

According to some example embodiments, a semiconductor device may include a plurality of active regions on a semiconductor substrate, a plurality of gate structures on separate, respective active regions of the plurality of active regions, and a plurality of source/drain regions in the semiconductor substrate, the plurality of source/drain regions on opposite sides of separate, respective gate structures of the plurality of gate structures. Each separate gate structure of the plurality of gate structures may include a sequential stack of a high dielectric layer, a first work function metal layer, a second work function metal layer having a lower work function than the first work function metal layer, and a gate metal layer. The first work function metal layers of the plurality of gate structures may have different thicknesses, such that the plurality of gate structures includes a largest gate structure, the first work function metal layer of the largest gate structure having a largest thickness of the first work function metal layers of the plurality of gate structures. The largest gate structure may further include a capping layer on the high dielectric layer of the largest gate structure, the capping layer including one or more impurity elements.

According to some example embodiments, a semiconductor device may include a semiconductor substrate including first to third active regions, a first gate structure on the first active region, a second gate structure on the second active region, a third gate structure on the third active region, and a plurality of source/drain regions in the semiconductor substrate, the plurality of source/drain regions on opposite sides of separate, respective gate structures of the first to third gate structures. The first gate structure may include a sequential stack of a first high dielectric layer, a first work function metal layer, a second work function metal layer having a lower work function than the first work function metal layer, and a first gate metal layer. The second gate structure may include a sequential stack of a second high dielectric layer having a common material as the first high dielectric layer, a third work function metal layer having a common material as the first work function metal layer and having a larger thickness than the first work function metal layer, a fourth work function metal layer having a common material as the second work function metal layer, and a second gate metal layer. The third gate structure may include a sequential stack of a third high dielectric layer having a common material as the second high dielectric layer, a capping layer including one or more impurity elements, a fifth work function metal layer having a common material as the third work function metal layer and having a larger thickness than the third work function metal layer, a sixth work function metal layer having a common material as the fourth work function metal layer, and a third gate metal layer.

According to some example embodiments, a semiconductor device may include a first transistor, a second transistor, and a third transistor. The first transistor may include a first fin-type active region, a first trench on the first fin-type active region, a first high dielectric layer on an inner wall of the first trench, a first work function metal layer on the first high dielectric layer in the first trench, and a second work function metal layer on the first work function metal layer and having a lower work function than the first work function metal layer. The second transistor may include a second fin-type active region, a second trench on the second fin-type active region, a second high dielectric layer on an inner wall of the second trench, a third work function metal layer on the second high dielectric layer in the second trench and having a larger thickness than the first work function metal layer, and a fourth work function metal layer on the third work function metal layer and having a lower work function than the third work function metal layer. The third transistor may include a third fin-type active region, a third trench on the third fin-type active region, a third high dielectric layer along an inner wall of the third trench, a capping layer on the third high dielectric layer in the third trench and comprising impurity elements, a fifth work function metal layer on the capping layer and having a larger thickness than the third work function metal layer, and a sixth work function metal layer on the fifth work function metal layer and having a lower work function than the fifth work function metal layer.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

In some example embodiments of the inventive concepts, the effective work function of a metal gate electrode comprising a gate structure is a parameter determined (or adjusted) by types of materials comprising the metal gate electrode and a manufacturing process, and may affect a threshold voltage of a transistor, i.e. a metal-oxide semiconductor (MOS) transistor.

The work function of a particular material (i.e., a metal layer) is an energy value required to release electrons from atoms (elements) of a material to vacuum when the electrons in the material are initially located at a Fermi level, and the work function denotes the intrinsic property of the material and may affect a threshold voltage of a transistor. Therefore, in the following description, the effective work function and the work function may be used with the same meaning.

Figure 1:
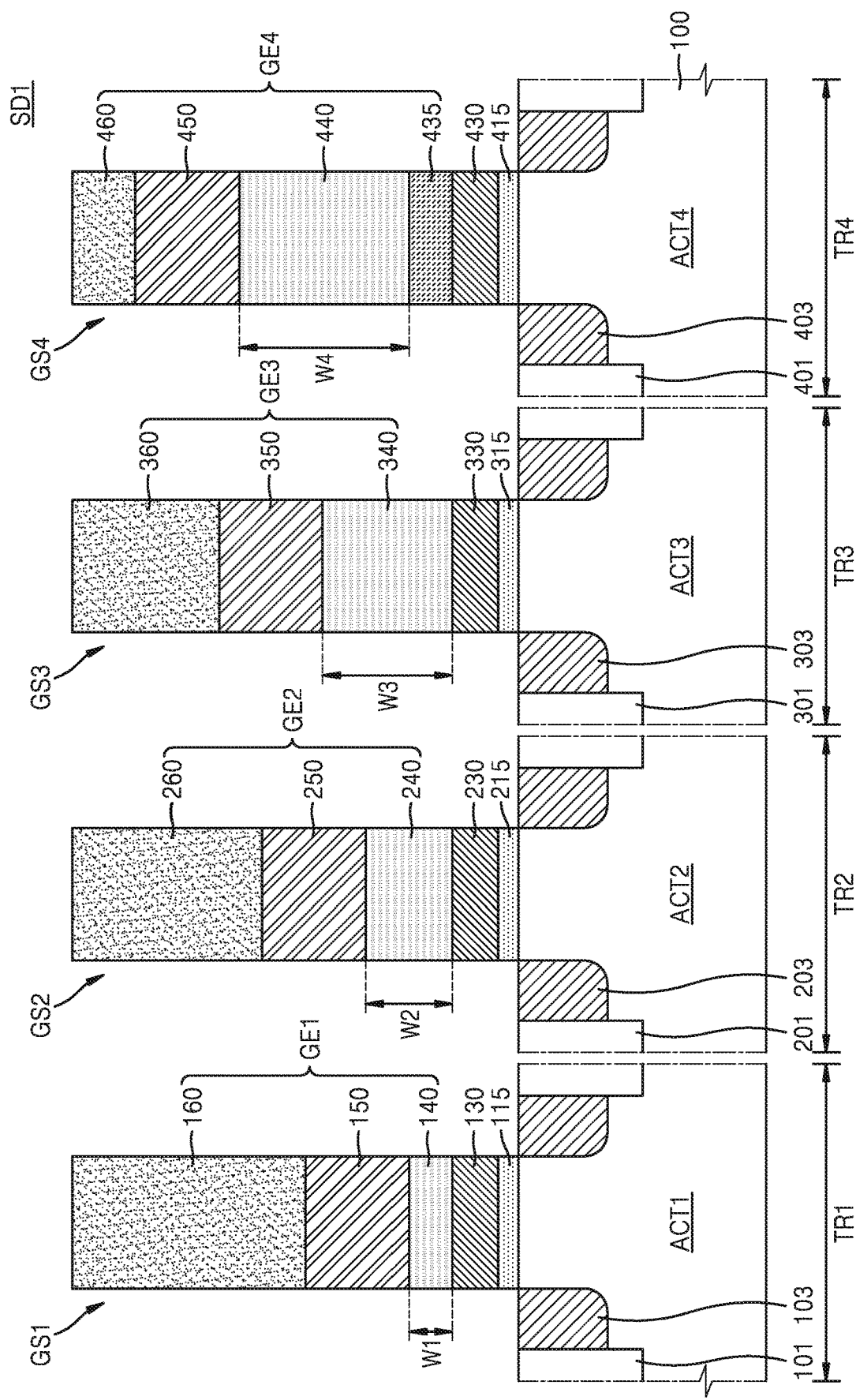
FIG. 1 is a cross-sectional view illustrating a semiconductor device according to some example embodiments of the inventive concepts.

FIG. 1 is a cross-sectional view illustrating a semiconductor device SD1 according to some example embodiments of the inventive concepts.

In detail, the semiconductor device SD1 may include a plurality of transistors, i.e., first to fourth transistors TR1 to TR4, having different effective work functions and accordingly different threshold voltages. The semiconductor device SD1 may be an integrated circuit semiconductor device. In some example embodiments, the semiconductor device SD1 is described as including four transistors TR1 to TR4 for convenience, but the semiconductor device SD1 may include fewer or more transistors.

The first to fourth transistors TR1 to TR4 may be MOS transistors. The first to fourth transistors TR1 to TR4 may be planar transistors. The first to fourth transistors TR1 to TR4 may be implemented on the semiconductor substrate 100. The semiconductor substrate 100 may be a single crystal silicon substrate. The semiconductor substrate 100 may be a silicon-on-insulator (SOI) substrate, a germanium substrate, a germanium-on-insulator (GOI) substrate, a silicon germanium substrate, or a substrate of an epitaxial thin film obtained by performing a selective epitaxial growth (SEG). The semiconductor substrate 100 may include a first conductivity type (e.g., P-type) well region or a second conductivity type (e.g., N-type) well region, where the second conductivity type is a type opposite to the first conductivity type.

The first transistor TR1 may include a first gate structure GS1 positioned on a first active region ACT1 of the semiconductor substrate 100 and a first source/drain region 103 formed in the semiconductor substrate 100 on both sides of the first gate structure GS1.

The first active region ACT1 may be defined by a first isolation layer 101. The first gate structure GS1 may include a first interface layer 115, a first high dielectric layer 130, a first work function metal layer 140, a second work function metal layer 150, and a first gate metal layer 160. The first work function metal layer 140, the second work function metal layer 150, and the first gate metal layer 160 constitute a first metal gate electrode GE1.

The first gate structure GS1 may include the first metal gate electrode GE1, and the first interface layer 115 and the first high dielectric layer 130 stacked between the first metal gate electrode GE1 and the first active region ACT1. The second work function metal layer 150 may include a material having a lower work function than that of the first work function metal layer 140.

The second transistor TR2 may include a second gate structure GS2 positioned on a second active region ACT2 of the semiconductor substrate 100 and a second source/drain region 203 formed in the semiconductor substrate 100 on both sides of the second gate structure GS2.

The second active region ACT2 may be defined by a second isolation layer 201. The second gate structure GS2 may include a second interface layer 215, a second high dielectric layer 230, a third work function metal layer 240, a fourth work function metal layer 250, and a second gate metal layer 260. The third work function metal layer 240, the fourth work function metal layer 250, and the second gate metal layer 260 constitute a second metal gate electrode GE2.

The second gate structure GS2 may include the second metal gate electrode GE2, and the second interface layer 215 and the second high dielectric layer 230 stacked between the second metal gate electrode GE2 and the second active region ACT2. The fourth work function metal layer 250 may include a material having a lower work function than that of the third work function metal layer 240.

The third transistor TR3 may include a third gate structure GS3 positioned on a third active region ACT3 of the semiconductor substrate 100 and a third source/drain region 303 formed in the semiconductor substrate 100 on both sides of the third gate structure GS3.

The third active region ACT3 may be defined by a third isolation layer 301. The third gate structure GS3 may include a third interface layer 315, a third high dielectric layer 330, a fifth work function metal layer 340, a sixth work function metal layer 350, and a third gate metal layer 360. The fifth work function metal layer 340, the sixth work function metal layer 350, and the third gate metal layer 360 constitute a third metal gate electrode GE3.

The third gate structure GS3 may include the third metal gate electrode GE3, and the third interface layer 315 and the third high dielectric layer 330 stacked between the third metal gate electrode GE3 and the third active region ACT3. The sixth work function metal layer 350 may include a material having a lower work function than that of the fifth work function metal layer 340.

The fourth transistor TR4 may include a fourth gate structure GS4 positioned on a fourth active region ACT4 of the semiconductor substrate 100 and a fourth source/drain region 403 formed in the semiconductor substrate 100 on both sides of the fourth gate structure GS4.

The fourth active region ACT4 may be defined by a fourth isolation layer 401. The fourth gate structure GS4 may include a fourth interface layer 415, a fourth high dielectric layer 430, a capping layer 435, a seventh work function metal layer 440, an eighth work function metal layer 450, and a fourth gate metal layer 460. The capping layer 435, the seventh work function metal layer 440, the eighth work function metal layer 450, and the fourth gate metal layer 460 constitute a fourth metal gate electrode GE4.

The capping layer 435 is positioned on the fourth high dielectric layer 430 to thereby protect the fourth high dielectric layer 430 from impurities implanted from the outside in a manufacturing process such as an etching process, a photolithography process, and a heat-treatment process. The capping layer 435 may include a metal that is the same (e.g., a common metal) as that of the seventh work function metal layer 440 and further contains ("includes") impurity elements, e.g., one or more silicon elements.

Due to the capping layer 435, the fourth high dielectric layer 430 (e.g., the high dielectric layer of the largest gate structure (GS4)) may have a lower nitrogen concentration than the first to third high dielectric layers 130, 230, and 330 (a remainder of high dielectric layers (130, 230, 330) of the gate structures GS1 to GS4). The capping layer 435 may be formed to be thin to avoid affecting the work function of the fourth metal gate electrode GE4.

The fourth gate structure GS4 may include the fourth metal gate electrode GE4, and the fourth interface layer 415 and the fourth high dielectric layer 430 stacked between the fourth metal gate electrode GE4 and the fourth active region ACT4. The eighth work function metal layer 450 may include a material having a lower work function than that of the seventh work function metal layer 440.

Two or more of the high dielectric layers (130, 230, 330, 430) may have a common material. Two or more of the first, third, fifth, and seventh work function metal layers (140, 240, 340, 440) may have a common material. As shown in FIG. 1, the third work function metal layer may have a larger thickness (W2) than the first work function metal layer 140 (W1), and the fifth work function metal layer 340 may have a larger thickness (W3) than the third work function metal layer 240 (W2). Two or more of the second, fourth, sixth, and eighth work function metal layers (150, 250, 350, 450) may have a common material As shown in FIG. 1, the first to fourth active regions ACT1 to ACT4 may be referred to herein as a plurality of active regions ACT1 to ACT4 on semiconductor substrate 100, and the first to fourth gate structures GS1 to GS4 may be referred to herein as a plurality of gate structures GS1 to GS4 on separate, respective active regions of the plurality of active regions ACT1 to ACT4.

In addition, as shown in FIG. 1, first to fourth source/drain regions 103, 203, 303, and 403 may be referred to herein as a plurality of source/drain regions 103, 203, 303, and 403 in the semiconductor substrate 100, where the plurality of source/drain regions 103, 203, 303, and 403 are on opposite sides of separate, respective gate structures of the plurality of gate structures GS1 to GS4.

As shown in FIG. 1, each separate gate structure GS1 to GS4 includes a sequential stack of a high dielectric layer (130, 230, 330, 430), a first work function metal layer (140, 240, 340, 440), a second work function metal layer (150, 250, 350, 450), and a gate metal layer (160, 260, 360, 460), where the second work function metal layer of the separate gate structure has a lower work function that the first work function metal layer of the separate gate structure, and where the first work function metal layers (140, 240, 340, 440) of the gate structures GS1 to GS4 have different thicknesses (W1, W2, W3, W4).

As shown in FIG. 1, where the first work function metal layers (140, 240, 340, 440) of the gate structures GS1 to GS4 have different thicknesses, such that the plurality of gate structures GS1 to GS4 includes a largest gate structure (e.g., GS4), the first work function metal layer (e.g., 440) of the largest gate structure (e.g., GS4) has a largest thickness (W4) of the first work function metal layers (140, 240, 340, 440) of the plurality of gate structures GS1 to GS4. As shown in FIG. 1, the largest gate structure (e.g., GS4) includes a capping layer (435) on the high dielectric layer (e.g., 430) of the largest gate structure (e.g., GS4), where the capping layer includes one or more impurity elements.

Since the first to fourth active regions ACT1 to ACT4 are formed adjacent to the surface of the semiconductor substrate 100, the first to fourth active regions ACT1 to ACT4 may be referred to as planar active regions. The first to fourth interface layers 115, 215, 315, and 415 may not be formed if necessary. The first to fourth interface layers 115, 215, 315, and 415 may include a low dielectric material having a dielectric constant of 9 or less. For example, the first to fourth interface layers 115, 215, 315, and 415 may be silicon oxide films or silicon oxynitride films. The first to fourth interface layers 115, 215, 315, and 415 may reduce interface defects between the semiconductor substrate 100 and the first to fourth high dielectric layers 130, 230, 330, and 430.

Restated, the gate structures GS1 to GS4 may include an interface layer (e.g., 115, 215, 315, 415) between the semiconductor substrate 100 and the high dielectric layers (130, 230, 330, 430) of the gate structures GS1 to GS4.

In some example embodiments, the first to fourth high dielectric layers 130, 230, 330, and 430 may include a high dielectric material having a dielectric constant that is greater than that of silicon oxide. In some example embodiments, the first to fourth high dielectric layers 130, 230, 330, and 430 may include a material having a dielectric constant of 7 or more. The first to fourth high dielectric layers 130, 230, 330, and 430 may be thicker than the first to fourth interface layers 115, 215, 315, and 415.

The first to fourth high dielectric layers 130, 230, 330, and 430 may include a metal oxide, a metal silicate, a metal silicate nitride, or the like. The metal oxide includes an oxide containing a metal such as hafnium (Hf), aluminum (Al), lanthanum (La), zirconium (Zr), titanium (Ti), or tantalum (Ta). For example, the metal oxide may include hafnium oxide ($HfO_2$), aluminum oxide ($Al_2O_3$), lanthanum oxide ($La_2O_3$), zirconium oxide ($ZrO_2$), titanium oxide, tantalum oxide, or a combination of these materials.

The metal silicate includes a silicate containing a metal such as Hf or Zr. For example, the metal silicate may include hafnium silicate (HfSiO), zirconium silicate (ZrSiO), or a combination thereof. The metal silicate nitride includes a silicate containing a metal such as Hf or Zr. For example, the metal silicate nitride may include hafnium silicate nitride (HfSiON), zirconium silicate nitride (ZrSiON), or a combination thereof.

The first, third, fifth, and seventh work function metal layers 140, 240, 340, and 440 may be work function metal layers of the first conductivity type (i.e., P-type). The first, third, fifth, and seventh work function metal layers 140, 240, 340, and 440 may include a material having a higher work function than that of the second, fourth, sixth, and eighth work function metal layers 150, 250, 350, and 450.

In some example embodiments, the first, third, fifth, and seventh work function metal layers 140, 240, 340, and 440 may include a metallic material having a work function of about 4.7 eV to about 5.2 eV. The first, third, fifth, and seventh work function metal layers 140, 240, 340 and 440 may include a metal nitride, a metal oxynitride, a metal oxycarbide, or a metal oxynitride carbide, each of which includes a metal such as Ti, Ta, niobium (Nb), molybdenum (Mo), or tungsten (W).

The second, fourth, sixth, and eighth work function metal layers 150, 250, 350, and 450 may be work function metal layers of the second conductivity type (i.e., N-type). The second, fourth, sixth, and eighth work function metal layers 150, 250, 350, and 450 may include a material having a lower work function than that of the first, third, fifth, and seventh work function metal layers 140, 240, 340, and 440. In some example embodiments, the second, fourth, sixth, and eighth work function metal layers 150, 250, 350, and 450 may include a metallic material having a work function of about 3.9 eV to about 4.4 eV.

In some example embodiments, the second, fourth, sixth, and eighth work function metal layers 150, 250, 350, and 450 may include a conductive material including aluminum (Al). For example, the second, fourth, sixth, and eighth work function metal layers 150, 250, 350, and 450 may include a metal aluminide, a metal aluminum carbide, or a metal aluminum nitride. The second, fourth, sixth, and eighth work function metal layers 150, 250, 350, and 450 may include TiAl, TiAlC, TiAlN, TaAlC, TaAlN, or the like.

The first to fourth gate metal layers 160, 260, 360, and 460 may include a material having a low resistivity, for example, a metal layer. In some example embodiments, the first to fourth gate metal layers 160, 260, 360, and 460 may include titanium nitride (TiN), tungsten (W), or a stack structure of TiN and W. In some example embodiments, the first to fourth gate metal layers 160, 260, 360, and 460 may include TiN.

In the semiconductor device SD1, the thicknesses of the second, fourth, sixth, and eighth work function metal layers 150, 250, 350, and 450 may be the same and the thicknesses of the first, third, fifth, and seventh work function metal layers 140, 240, 340, and 440 may be adjusted. For example, the thickness W2 of the third work function metal layer 240 may be greater than the thickness W1 of the first work function metal layer 140. The thickness W3 of the fifth work function metal layer 340 may be greater than the thickness W2 of the third work function metal layer 240. The thickness W4 of the seventh work function metal layer 440 may be greater than the thickness W3 of the fifth work function metal layer 340.

Accordingly, in the semiconductor device SD1, since the first, third, fifth, and seventh work function metal layers 140, 240, 340, and 440 have different thicknesses, the first, third, fifth, and seventh work function metal layers 140, 240, 340, and 440 may have different effective work functions. Thus, threshold voltages of the first to fourth transistors TR1 to TR4 in the semiconductor device SD1 may be different from each other.

In some example embodiments, the first, third, fifth, and seventh work function metal layers 140, 240, 340, and 440 in the semiconductor device SD1 may have different thicknesses, and thus an effective work function may increase in the order of the first metal gate electrode GE1, the second metal gate electrode GE2, the third metal gate electrode GE3, and the fourth metal gate electrode GE4. In other words, the effective work function may increase in the order of the first transistor TR1, the second transistor TR2, the third transistor TR3, and the fourth transistor TR4.

In some example embodiments, when the first transistor TR1, the second transistor TR2, the third transistor TR3, and the fourth transistor TR4 are transistors of the second conductivity type, i.e., the N-type, a threshold voltage may increase in the order of the first transistor TR1, the second transistor TR2, the third transistor TR3, and the fourth transistor TR4.

In some example embodiments, when the first transistor TR1, the second transistor TR2, the third transistor TR3, and the fourth transistor TR4 are transistors of the first conductivity type, i.e., the P-type, a threshold voltage may decrease in the order of the first transistor TR1, the second transistor TR2, the third transistor TR3, and the fourth transistor TR4.

In some example embodiments, the first transistor TR1 and the second transistor TR2 may be transistors of the second conductivity type, i.e., the N-type. In this case, the threshold voltage of the first transistor TR1 may be less than that of the second transistor TR2 because the effective work function of the first transistor TR1 is less than that of the second transistor TR2. The third transistor TR3 and the fourth transistor TR4 may be transistors of the first conductivity type (i.e., the P-type) opposite to the second conductivity type. In this case, the threshold voltage of the fourth transistor TR4 may be less than that of the third transistor TR3 because the effective work function of the fourth transistor TR4 is greater than that of the third transistor TR3.

In some example embodiments, including the example embodiments shown in FIG. 1, one or more gate structures of a limited portions of gate structures excluding the largest gate structure (e.g., gate structures GS1 to GS3) may be of a first conductivity type (e.g., P-type) based on the corresponding source/drain regions (e.g., 103, 230, 330) being of the first conductivity type (e.g., P-type).

In some example embodiments, including the example embodiments shown in FIG. 1, the largest gate structure, as the term is understood herein to refer to the gate structure including a first work function metal layer having a largest thickness among the first work function metal layers, (e.g., gate structure GS4 including seventh work function metal layer 440 having a largest thickness W4) may be of a second conductivity type that is opposite to the first conductivity type (e.g., an N-type) based on at least the corresponding source/drain region (e.g., 403) being of the second conductivity type.

As described above, according to the embodiments of the inventive concepts, the effective work functions of the first to fourth metal gate electrodes GE1 to GE4 are adjusted according to the thicknesses of the first, third, fifth and seventh work function metal layers 140, 240, 340 and 440. For example, assuming that a work function variation according to the thicknesses of the first, third, fifth, and seventh work function metal layers 140, 240, 340, and 440 is 10 mV/Å, the thicknesses of the first, third, fifth, and seventh work function metal layers 140, 240, 340, and 440 have to be changed by 5Å to change a threshold voltage by 50 mV.

For example, in order for a threshold voltage difference between the third transistor TR3 and the fourth transistor TR4 to be 50 mV, a thickness difference between the fifth work function metal layer 340 and the seventh work function metal layer 440 between the third transistor TR3 and the fourth transistor TR4 has to be 5 Å assuming that the other conditions are the same. However, the thickness difference between the fifth work function metal layer 340 and the seventh work function metal layer 440 is so small that the third high dielectric layer 330 or the fourth high dielectric layer 430 may be damaged during a manufacturing process, e.g., a photolithography process or a heat treatment process.

In particular, when the third transistor TR3 and the fourth transistor TR4 are transistors of the first conductivity type, i.e., the P-type, the seventh work function metal layer 440 may have the highest effective work function and the lowest threshold voltage because the seventh work function metal layer 440 has the largest thickness. Since the semiconductor device SD1 is highly integrated and a high electric field is applied to the thin fourth high dielectric layer 430, negative bias temperature instability (NBTI) characteristics may deteriorate.

Accordingly, in the semiconductor device SD1 of some example embodiments, a capping layer 435, which may protect the fourth high dielectric layer 430 in the manufacturing process and improve NBTI reliability, may be provided under the seventh work function metal layer 440, which is the thickest layer among the first, third, fifth, and seventh work function metal layers 140, 240, 340, and 440, and on the fourth high dielectric layer 430.

In some example embodiments, the capping layer 435 may have a small thickness, e.g., a thickness of several nanometers, to avoid affecting the work function of the fourth metal gate electrode GE4. In some example embodiments, the capping layer 435 may have a small thickness, e.g., a thickness of 1 nanometer to 2 nanometers, to avoid affecting the work function of the fourth metal gate electrode GE4. As described above, the capping layer 435 may be formed by further including impurity elements, e.g., silicon elements, in the same metal as the seventh work function metal layer 440. Restated, the capping layer 435 may include a metal layer, and the metal layer may include one or more silicon elements.

Figure 2:
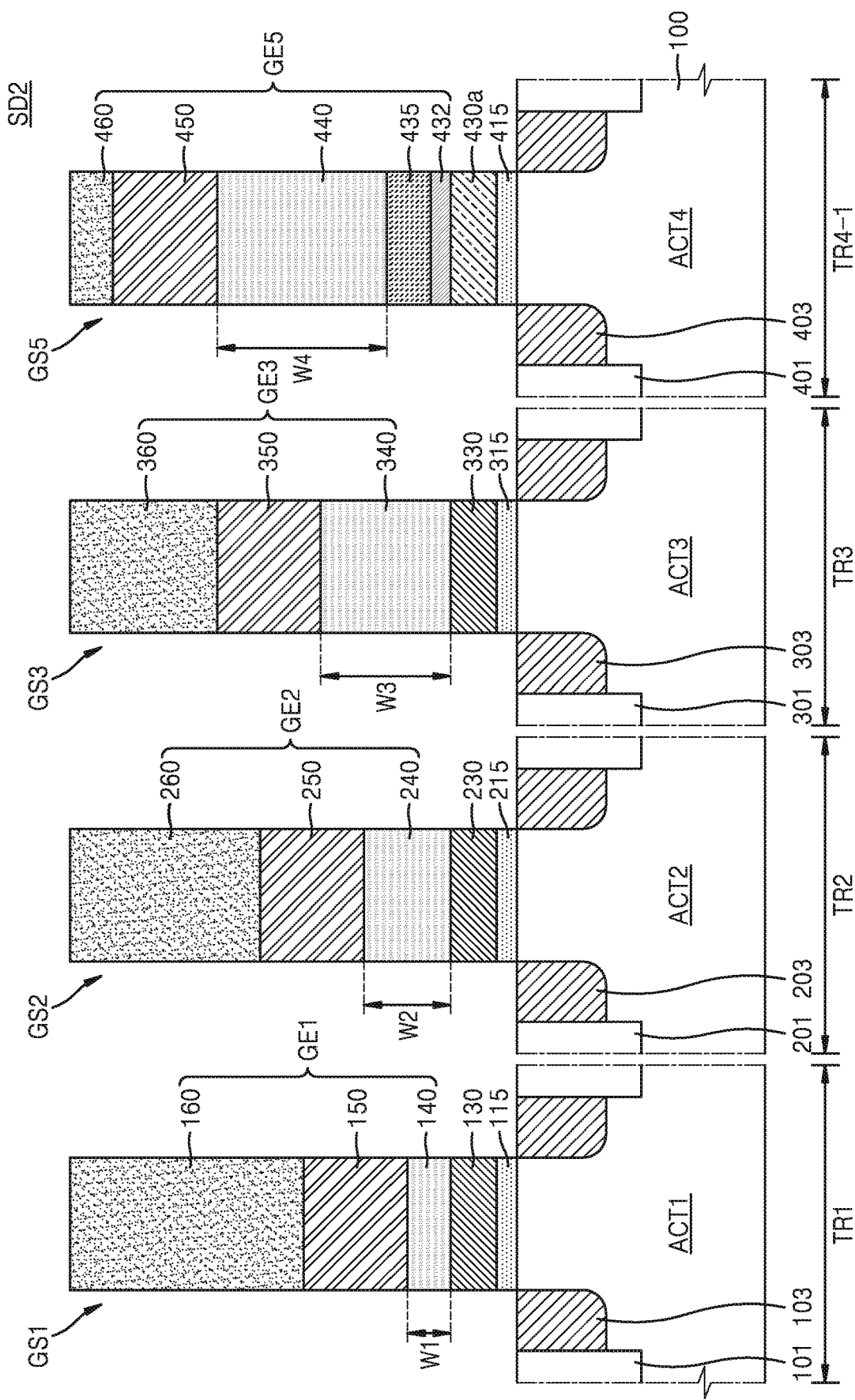
FIG. 2 is a cross-sectional view illustrating a semiconductor device according to some example embodiments of the inventive concepts.

FIG. 2 is a cross-sectional view illustrating a semiconductor device SD2 according to some example embodiments of the inventive concepts.

Specifically, the semiconductor device SD2 of FIG. 2 may be the same as the semiconductor device SD1 of FIG. 1 except for a fourth transistor TR4-1. In the description of the semiconductor device SD2 in FIG. 2, the same description as that of the semiconductor device SD1 in FIG. 1 is briefly given or omitted.

The semiconductor device SD2 may include a plurality of transistors, i.e., first to fourth transistors TR1 to TR3 and TR4-1, having different effective work functions and accordingly different threshold voltages. The first transistor TR1, the second transistor TR2, and the third transistor TR3 are the same as those illustrated in FIG. 1, and thus will not be described.

The fourth transistor TR4-1 may include a fifth gate structure GS5 positioned on a fourth active region ACT4 of a semiconductor substrate 100 and a fourth source/drain region 403 formed in the semiconductor substrate 100 on both sides of the fifth gate structure GS5.

The fifth gate structure GS5 may include a fourth interface layer 415, a fourth high dielectric layer 430a doped with a work function control material, a fourth work function control layer 432, a capping layer 435, a seventh work function metal layer 440, an eighth work function metal layer 450, and a fourth gate metal layer 460. The fourth work function control layer 432, the capping layer 435, the seventh work function metal layer 440, the eighth work function metal layer 450, and the fourth gate metal layer 460 constitute a fifth metal gate electrode GE5. Restated, where the fifth gate structure GS5 is the largest gate structure of gate structures GS1 to GS5, by virtue of the first work function metal layer (440) of the fifth gate structure GS5 having a largest thickness of the first work function metal layers (140, 240, 340, 440), the fourth work function control layer 432 may be between the capping layer 435 and the high dielectric layer 430a of the largest gate structure (GS5).

The work function control material of the fourth work function control layer 432 may be diffused into the fourth high dielectric layer 430a and thus may change the effective work function of the fifth gate structure GS5 to thereby modulate a threshold voltage of the fourth transistor TR4-1.

In some example embodiments, the work function control material may be a non-metallic material and may include, for example, nitrogen (N), fluorine (F), or carbon (C). In some example embodiments, the work function control material may be a metal-based material. The work function control material may include a material having electronegativity different from that of a metal material in the fourth high dielectric layer 430a. The work function control material may include Al, Mg, Ca, Sr, V, Nb, Sc, Y, a lanthanoid material, or a combination thereof.

The semiconductor device SD2 may include the capping layer 435, which may protect the fourth high dielectric layer 430a in the manufacturing process and improve NBTI reliability, under the seventh work function metal layer 440, which is the thickest layer among the first, third, fifth, and seventh work function metal layers 140, 240, 340, and 440, and on the fourth high dielectric layer 430a. In addition, in the semiconductor device SD2, the fourth high dielectric layer 430a may include a work function control material, and thus, the effective work function of the fourth transistor TR4-1 may be adjusted and thus threshold voltages of the first to fourth transistors TR1 to TR3 and TR4-1 may be easily adjusted.

Figure 3:
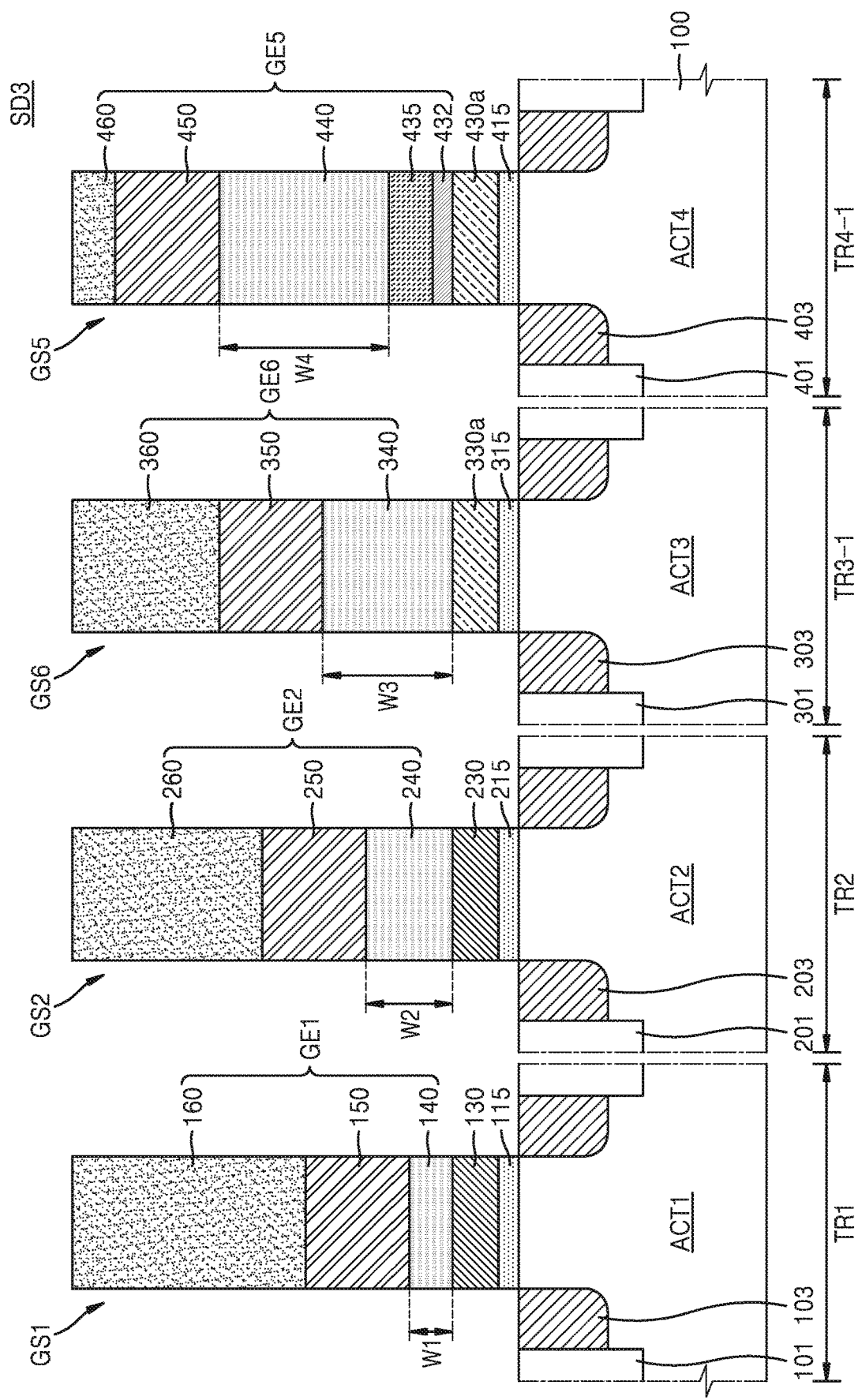
FIG. 3 is a cross-sectional view illustrating a semiconductor device according to some example embodiments of the inventive concepts.

FIG. 3 is a cross-sectional view illustrating a semiconductor device SD3 according to some example embodiments of the inventive concepts.

Specifically, the semiconductor device SD3 of FIG. 3 may be the same as the semiconductor device SD2 of FIG. 2 except for a third transistor TR3-1. In the description of the semiconductor device SD3 in FIG. 3, the same description as that of the semiconductor device SD1 in FIG. 1 and the semiconductor device SD2 in FIG. 2 is briefly given or omitted.

The semiconductor device SD3 may include a plurality of transistors, i.e., first to fourth transistors TR1, TR2, TR3-1, and TR4-1, having different effective work functions and accordingly different threshold voltages. The first transistor TR1, the second transistor TR2, and the fourth transistor TR4-1 are the same as those illustrated in FIGS. 1 and 2, and thus will not be described.

The third transistor TR3-1 may include a sixth gate structure GS6 positioned on a third active region ACT3 of a semiconductor substrate 100 and a third source/drain region 303 formed in the semiconductor substrate 100 on both sides of the sixth gate structure GS6.

The sixth gate structure GS6 may include a third interface layer 315, a third high dielectric layer 330a doped with a work function control material, a fifth work function metal layer 340, a sixth work function metal layer 350, and a third gate metal layer 360. The fifth work function metal layer 340, the sixth work function metal layer 350, and the third gate metal layer 360 constitute a sixth metal gate electrode GE6.

The work function control material of the third high dielectric layer 330a may change the effective work function of the sixth gate structure GS6 to thereby modulate a threshold voltage of the third transistor TR3-1. The work function control material is the same as that described with reference to FIG. 2 and thus the description thereof is omitted. In FIG. 3, the work function control material is included in the third high dielectric layer 330a, but may also be included in first and second high dielectric layers 130 and 230 as needed.

In the semiconductor device SD3, since the third high dielectric layer 330a includes the work function control material, the effective work function of the third transistor TR3-1 may be adjusted and thus threshold voltages of the first to fourth transistors TR1, TR2, TR3-1, and TR4-1 may be easily adjusted.

Figure 4:
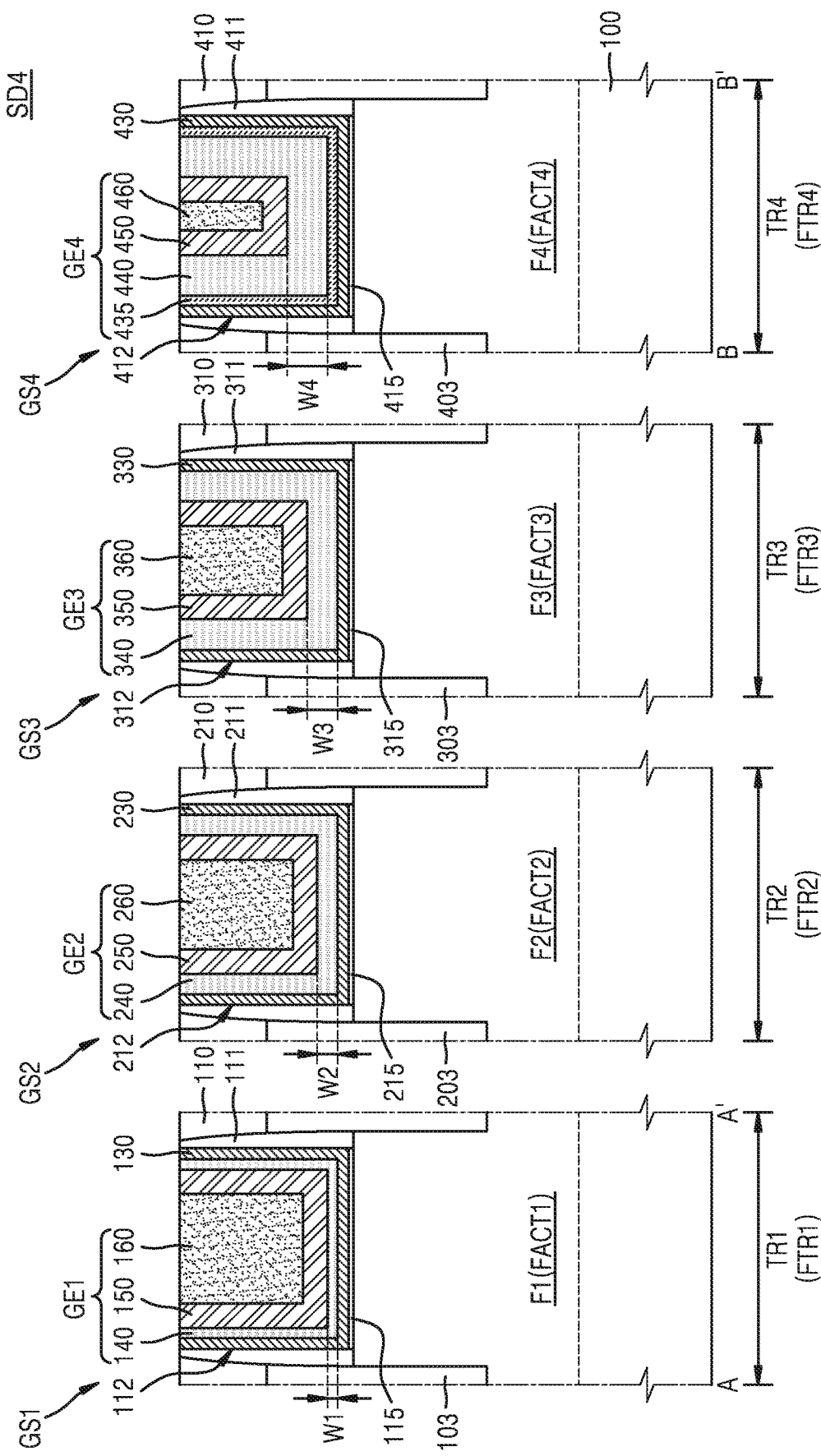
FIG. 4 is a cross-sectional view illustrating a semiconductor device according to some example embodiments of the inventive concepts.
Figure 5:
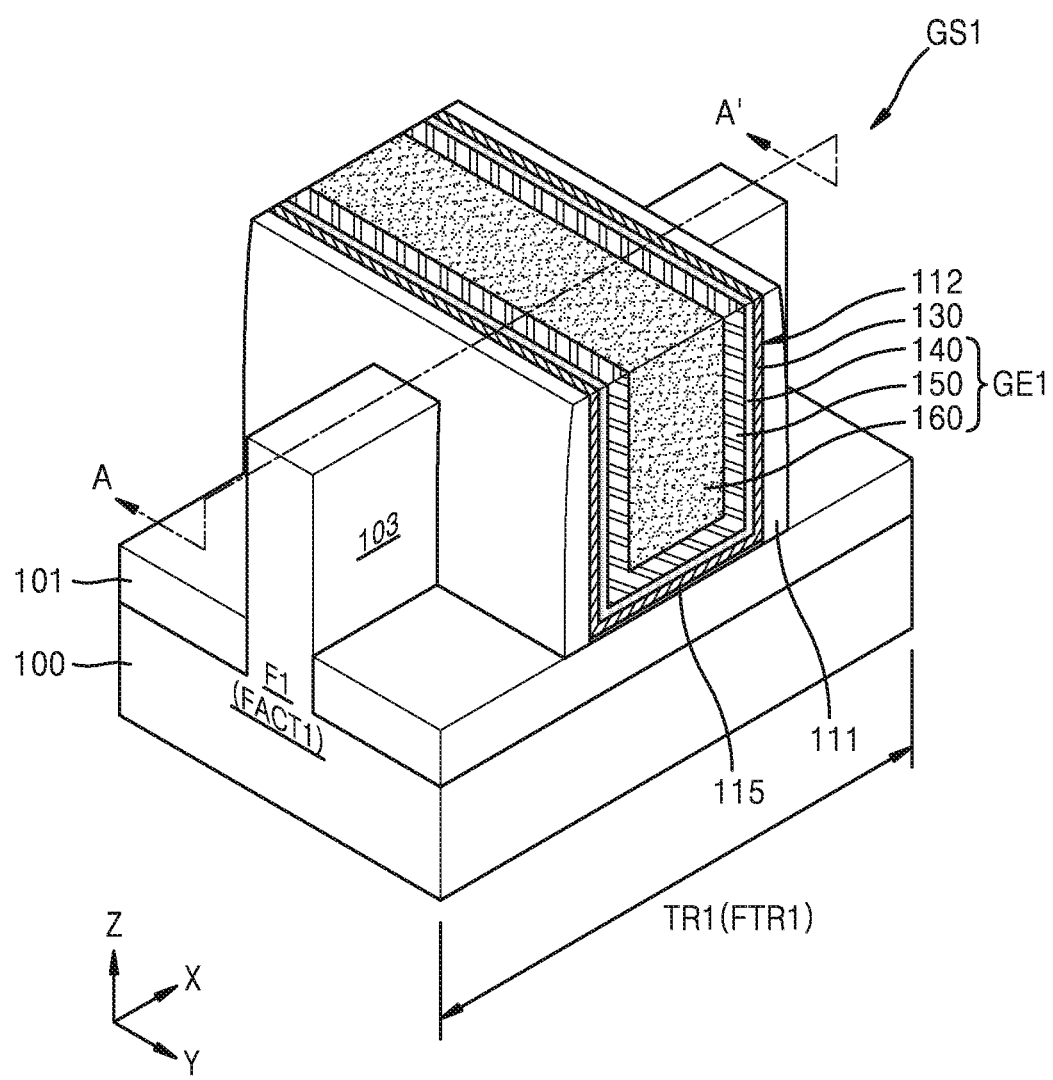
FIG. 5 and FIG. 6 are perspective views illustrating a first transistor and a fourth transistor of FIG. 4, respectively.
Figure 6:
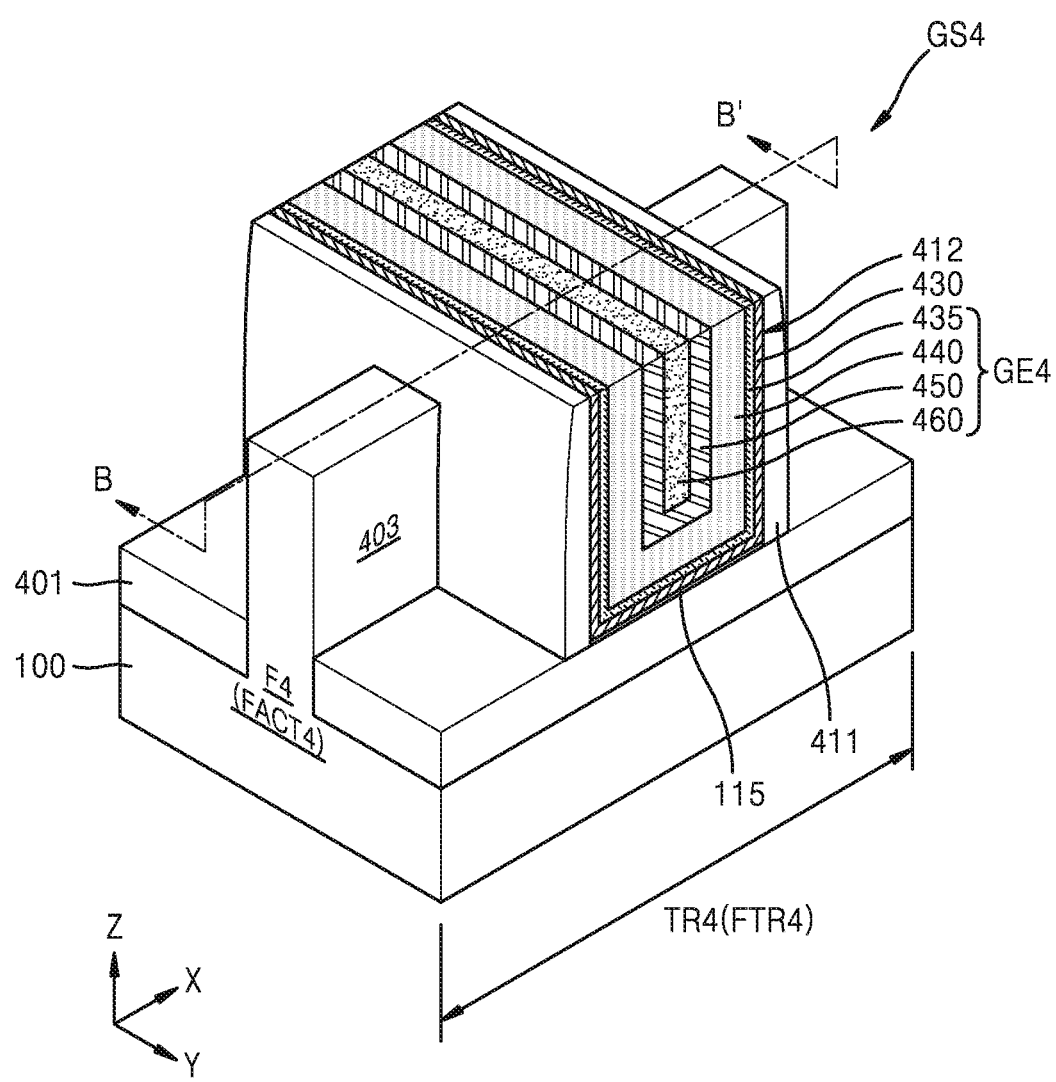

FIG. 4 is a cross-sectional view illustrating a semiconductor device SD4 according to some example embodiments of the inventive concepts, and FIG. 5 and FIG. 6 are perspective views illustrating a first transistor and a fourth transistor of FIG. 4, respectively.

Specifically, the semiconductor device SD4 of FIG. 4 may be the same as the semiconductor device SD1 of FIG. 1 except that first to fourth transistors TR1 to TR4 are fin-type transistors. In the description of the semiconductor device SD4 in FIG. 4, the same description as that of the semiconductor device SD1 in FIG. 1 is briefly given or omitted.

In some example embodiments, at least one transistor of the first to fourth transistors TR1 to TR4 (e.g., TR1 and TR2) is a metal-oxide semiconductor (MOS) transistors of a first conductivity type (e.g., P-type), and at least one transistor of the first to fourth transistors TR1 to TR4 (e.g., TR3) is a MOS transistor of a second conductivity type opposite to the first conductivity type (e.g., N-type).

The semiconductor device SD4 may include the first to fourth transistors TR1 to TR4 having different effective work functions and accordingly different threshold voltages. The first to fourth transistors TR1 to TR4 may be fin-type transistors, i.e., first to fourth fin-type transistors FTR1 to FTR4, formed on first to fourth fin-type active regions FACT1 to FACT4, respectively. The first to fourth fin-type transistors FTR1 to FTR4 may be transistors using a three-dimensional channel.

The first fin-type transistor FTR1 may include a first gate structure GS1 positioned on the first fin-type active region FACT1 and a first source/drain region 103 formed in or on the first fin-type active region FACT1 on both sides of the first gate structure GS1.

As shown in at least FIG. 4, gate structures GS1 to GS4 are in separate, respective trenches (112, 212, 312, 412) on separate, respective fin-type active regions FACT1 to FACT4.

The first gate structure GS1 may be formed in a first trench 112 inside a first interlayer insulating layer 110 and a first spacer 111. The first gate structure GS1 may include a first interface layer 115, a first high dielectric layer 130, a first work function metal layer 140, a second work function metal layer 150, and a first gate metal layer 160, formed in the first trench 112.

The first interface layer 115 may be formed on the surface of the first fin-type active region FACT1 and on the bottom of the first trench 112. The first high dielectric layer 130 may be formed on the first interface layer 115 and on the inner wall of the first trench 112. The first work function metal layer 140 may be formed on the first high dielectric layer 130 in the first trench 112.

The second work function metal layer 150 may be formed on the first work function metal layer 140 in the first trench 112 by using a material having a lower work function than that of the first work function metal layer 140. As referred to herein, a layer formed by using a material having a lower work function than that of another layer will be understood to be a layer having a lower work function than the other layer. The first gate metal layer 160 may be formed on the second work function metal layer 150 while filling the inside of the first trench 112.

The first work function metal layer 140, the second work function metal layer 150 and the first gate metal layer 160 constitute a first metal gate electrode GE1. The materials of the first interface layer 115, the first high dielectric layer 130, the first work function metal layer 140, and the second work function metal layer 150 have been described above and thus will not be described here.

The semiconductor device SD4 may include the second fin-type transistor FTR2 and the third fin-type transistor FTR3. The second fin-type transistor FTR2 may include a second gate structure GS2 positioned on the second fin-type active region FACT2 and a second source/drain region 203 formed in or on the second fin-type active region FACT2 on both sides of the second gate structure GS2. The third fin-type transistor FTR3 may include a third gate structure GS3 positioned on the third fin-type active region FACT3 and a third source/drain region 303 formed in or on the third fin-type active region FACT3 on both sides of the third gate structure GS3.

The second gate structure GS2 may be formed in a second trench 212 inside a second interlayer insulating layer 210 and a second spacer 211, and the third gate structure GS3 may be formed in a third trench 312 inside a third interlayer insulating layer 310 and a third spacer 311. The second gate structure GS2 may include a second interface layer 215, a second high dielectric layer 230, a third work function metal layer 240, a fourth work function metal layer 250, and a second gate metal layer 260, formed in the second trench 212, and the third gate structure GS3 may include a third interface layer 315, a third high dielectric layer 330, a fifth work function metal layer 340, a sixth work function metal layer 350, and a third gate metal layer 360, formed in the third trench 312.

The second interface layer 215 may be formed on the surface of the second fin-type active region FACT2 and on the bottom of the second trench 212, and the third interface layer 315 may be formed on the surface of the third fin-type active region FACT3 and on the bottom of the third trench 312. The second high dielectric layer 230 may be formed on the second interface layer 215 and on the inner wall of the second trench 212, and the third high dielectric layer 330 may be formed on the third interface layer 315 and on the inner wall of the third trench 312. The third work function metal layer 240 may be formed on the second high dielectric layer 230 in the second trench 212, and the fifth work function metal layer 340 may be formed on the third high dielectric layer 330 in the third trench 312.

The fourth work function metal layer 250 may be formed on the third work function metal layer 240 in the second trench 212 by using a material having a lower work function than that of the third work function metal layer 240, and the sixth work function metal layer 350 may be formed on the fifth work function metal layer 340 in the third trench 312 by using a material having a lower work function than that of the fifth work function metal layer 340. The second gate metal layer 260 may be formed on the fourth work function metal layer 250 while filling the inside of the second trench 212, and the third gate metal layer 360 may be formed on the sixth work function metal layer 350 while filling the inside of the third trench 312.

The third work function metal layer 240, the fourth work function metal layer 250 and the second gate metal layer 260 constitute a second metal gate electrode GE2. The fifth work function metal layer 340, the sixth work function metal layer 350 and the third gate metal layer 360 constitute a third metal gate electrode GE3. The materials of the second interface layer 215, the second high dielectric layer 230, the third work function metal layer 240, and the fourth work function metal layer 250 have been described above and thus will not be described here. Also, the materials of the third interface layer 315, the third high dielectric layer 330, the fifth work function metal layer 340, and the sixth work function metal layer 350 have been described above and thus will not be described here.

The semiconductor device SD4 may include the fourth fin-type transistor FTR4. The fourth fin-type transistor FTR4 may include a fourth gate structure GS4 positioned on the fourth fin-type active region FACT4 and a fourth source/drain region 403 formed in or on the fourth fin-type active region FACT4 on both sides of the fourth gate structure GS4.

The fourth gate structure GS4 may be formed in a fourth trench 412 inside a fourth interlayer insulating layer 410 and a fourth spacer 411. The fourth gate structure GS4 may include a fourth interface layer 415, a fourth high dielectric layer 430, a capping layer 435, a seventh work function metal layer 440, an eighth work function metal layer 450, and a fourth gate metal layer 460, formed in the fourth trench 412.

The fourth interface layer 415 may be formed on the surface of the fourth fin-type active region FACT4 and on the bottom of the fourth trench 412. The fourth high dielectric layer 430 may be formed on the fourth interface layer 415 and on the inner wall of the fourth trench 412. The capping layer 435 may be formed on the fourth high dielectric layer 430 in the fourth trench 412. The seventh work function metal layer 440 may be formed on the capping layer 435 in the fourth trench 412. The eighth work function metal layer 450 may be formed on the seventh work function metal layer 440 in the fourth trench 412 by using a material having a lower work function than that of the seventh work function metal layer 440. The fourth gate metal layer 460 may be formed on the eighth work function metal layer 450 while filling the inside of the fourth trench 412.

The capping layer 435, the seventh work function metal layer 440, the eighth work function metal layer 450, and the fourth gate metal layer 460 constitute a fourth metal gate electrode GE4. The materials of the fourth interface layer 415, the fourth high dielectric layer 430, the capping layer 435, the seventh work function metal layer 440, and the eighth work function metal layer 450 have been described above and thus will not be described here.

The first to fourth gate metal layers 160, 260, 360, and 460 of the first to fourth fin-type transistors FTR1 to FTR4 may include a material having low resistivity, for example, a metal. The first to fourth gate metal layers 160, 260, 360, and 460 of the first to fourth fin-type transistors FTR1 to FTR4 may be formed in the first to fourth trenches 112, 212, 312, and 412, respectively, which have narrow widths.

In some example embodiments, the first to fourth gate metal layers 160, 260, 360, and 460 of the first to fourth fin-type transistors FTR1 to FTR4 may include titanium nitride (TiN) or tungsten W, or may have a stack structure of TiN and W. In some example embodiments, preferably, the first to fourth gate metal layers 160, 260, 360, and 460 of the first to fourth fin-type transistors FTR1 to FTR4 may include TiN.

When the first to fourth gate metal layers 160, 260, 360, and 460 of the first to fourth fin-type transistors FTR1 to FTR4 include TiN or W, or have a stack structure of TiN and W, the first to fourth gate metal layers 160, 260, 360, and 460 of the first to fourth fin-type transistors FTR1 to FTR4 may have good adhesion properties with respect to the second work function metal layer 150, the fourth work function metal layer 250, the sixth work function metal layer 350, and the eighth work function metal layer 450, respectively.

In the semiconductor device SD4 according to some example embodiments, the effective work functions of the first to fourth metal gate electrodes GE1 to GE4 are adjusted according to the thicknesses W1 to W4 of the first, third, fifth, and seventh work function metal layers 140, 240, 340, and 440, respectively. The thickness W2 of the third work function metal layer 240 may be greater than the thickness W1 of the first work function metal layer 140, the thickness W3 of the fifth work function metal layer 340 may be greater than the thickness W2 of the third work function metal layer 240, and the thickness W4 of the seventh work function metal layer 440 may be greater than the thickness W3 of the fifth work function metal layer 340.

In addition, the semiconductor device SD4 may include the capping layer 435, which may protect the fourth high dielectric layer 430 in the manufacturing process and improve NBTI characteristics, under the seventh work function metal layer 440, which is the thickest layer among the first, third, fifth, and seventh work function metal layers 140, 240, 340, and 440, and on the fourth high dielectric layer 430.

In particular, when the first transistor TR1 and the second transistor TR2 are transistors of the second conductivity type, i.e., the N-type, and the third transistor TR3 and the fourth transistor TR4 are transistors of the first conductivity type, i.e., the P-type, the seventh work function metal layer 440 may have the highest effective work function and the lowest threshold voltage because the seventh work function metal layer 440 has the largest thickness. When the semiconductor device SD4 is highly integrated, NBTI characteristics may deteriorate because a high electric field is applied to the thin fourth high dielectric layer 430.

Accordingly, in the semiconductor device SD4 of some example embodiments, the capping layer 435, which may protect the fourth high dielectric layer 430 in the manufacturing process and improve NBTI reliability, may be provided under the seventh work function metal layer 440, which is the thickest layer among the first, third, fifth, and seventh work function metal layers 140, 240, 340, and 440, and on the fourth high dielectric layer 430. In some example embodiments, the capping layer 435 may have a small thickness, e.g., a thickness of several nanometers, to avoid affecting the work function of the fourth metal gate electrode GE4. In some example embodiments, the capping layer 435 may have a small thickness, e.g., a thickness of 1 nanometer to 2 nanometers, to avoid affecting the work function of the fourth metal gate electrode GE4.

Figure 7:
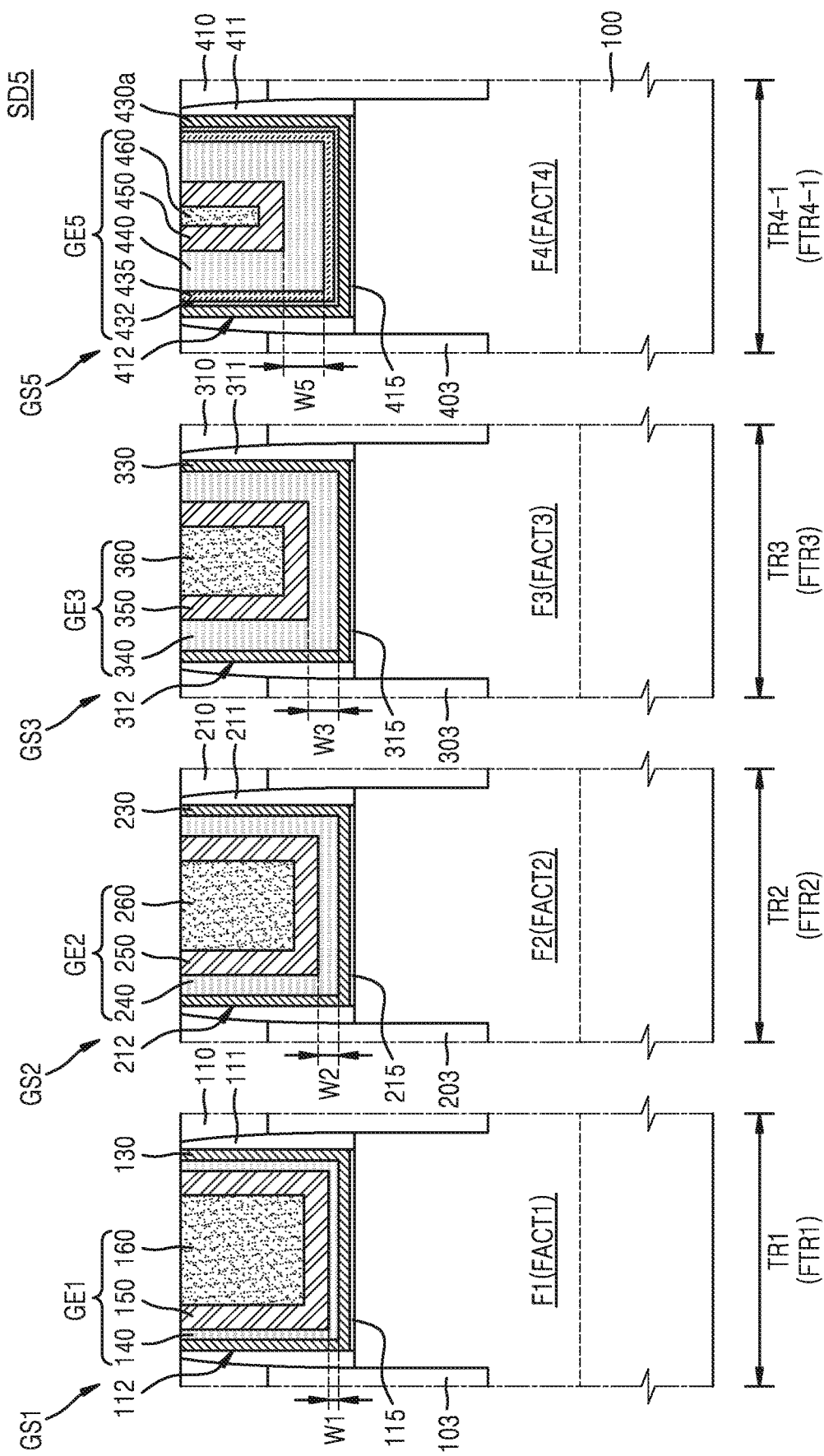
FIG. 7 is a cross-sectional view illustrating a semiconductor device according to some example embodiments of the inventive concepts.

FIG. 7 is a cross-sectional view illustrating a semiconductor device SD5 according to some example embodiments of the inventive concepts.

Specifically, the semiconductor device SD5 of FIG. 7 may be the same as the semiconductor device SD4 of FIGS. 4 to 6 except for a fourth fin-type transistor FTR4-1. In the description of the semiconductor device SD5 in FIG. 7, the same description as that of the semiconductor device SD4 in FIGS. 4 to 6 is briefly given or omitted.

The semiconductor device SD5 may include a plurality of fin-type transistors, i.e., first to fourth fin-type transistors FTR1 to FTR3 and FTR4-1, having different effective work functions and accordingly different threshold voltages. The first fin-type transistor FTR1, the second fin-type transistor FTR2, and the third fin-type transistor FTR3 are the same as those illustrated in FIGS. 4 to 6, and thus will not be described.

The fourth fin-type transistor FTR4-1 may include a fifth gate structure GS5 positioned on a fourth fin-type active region FACT4 and a fourth source/drain region 403 formed in the fourth fin-type active region FACT4 on both sides of the fifth gate structure GS5.

The fifth gate structure GS5 may include a fourth interface layer 415, a fourth high dielectric layer 430a doped with a work function control material, a fourth work function control layer 432, a capping layer 435, a seventh work function metal layer 440, an eighth work function metal layer 450, and a fourth gate metal layer 460. The fourth work function control layer 432, the capping layer 435, the seventh work function metal layer 440, the eighth work function metal layer 450, and the fourth gate metal layer 460 constitute a fifth metal gate electrode GE5.

The work function control material of the fourth work function control layer 432 may be diffused into the fourth high dielectric layer 430a and thus may change the effective work function of the fifth gate structure GS5 to thereby modulate a threshold voltage of the fourth fin-type transistor FTR4-1.

In some example embodiments, the work function control material may be a non-metallic material and may include, for example, N, F, or C. In some example embodiments, the work function control material may be a metal-based material. The work function control material may include a material having electronegativity different from that of a metal material in the fourth high dielectric layer 430a. The work function control material may include Al, Mg, Ca, Sr, V, Nb, Sc, Y, a lanthanoid material, or a combination thereof.

The semiconductor device SD5 may include the capping layer 435, which may protect the fourth high dielectric layer 430a in the manufacturing process and improve NBTI reliability, under the seventh work function metal layer 440, which is the thickest layer among the first, third, fifth, and seventh work function metal layers 140, 240, 340, and 440, and on the fourth high dielectric layer 430a. In addition, in the semiconductor device SD5, the fourth high dielectric layer 430a may include a work function control material, and thus, the effective work function of the fourth fin-type transistor FTR4-1 may be adjusted and thus threshold voltages of the first to fourth fin-type transistors FTR1 to FTR3 and FTR4-1 may be easily adjusted.

Figure 8:
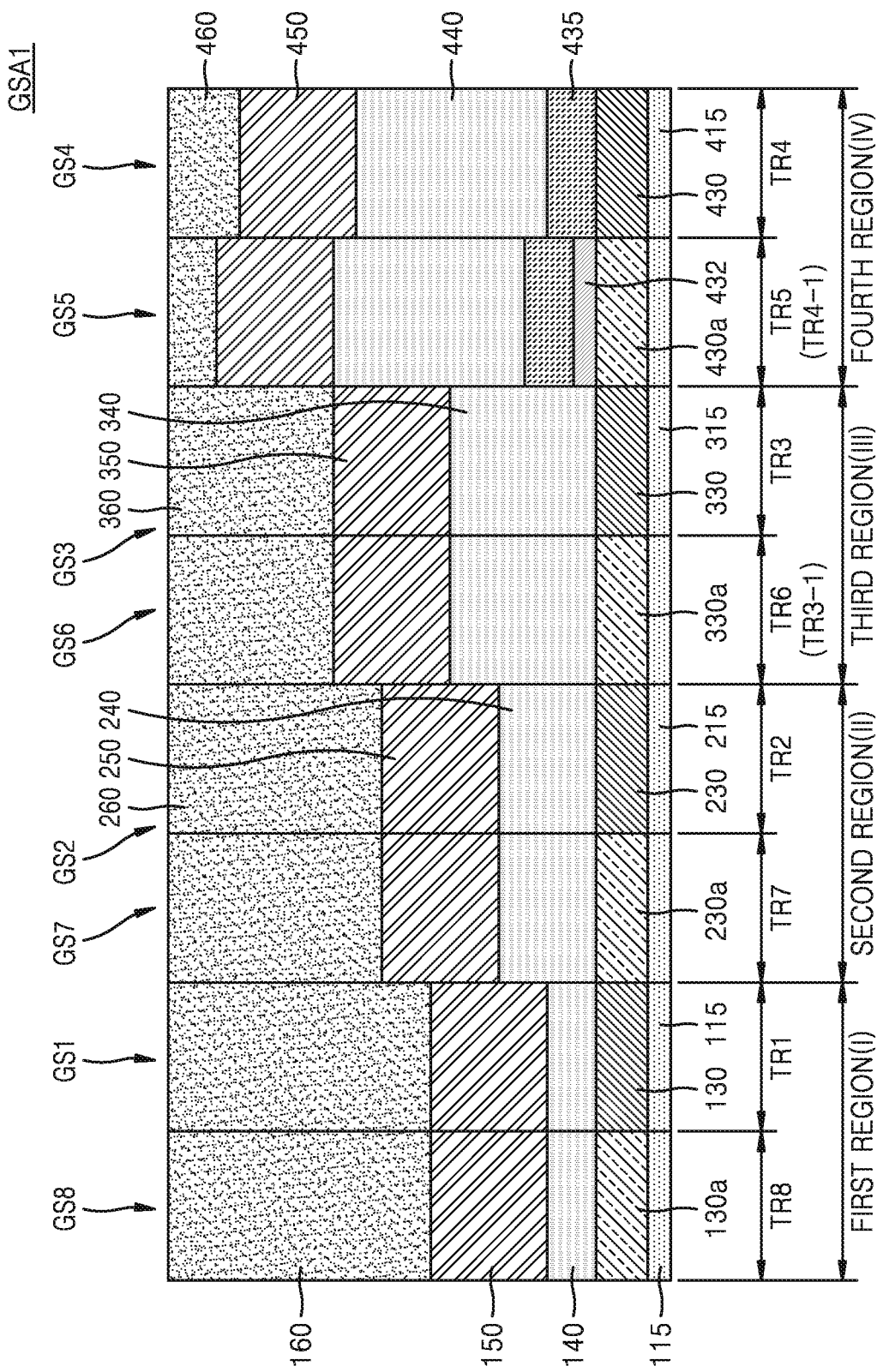
FIG. 8 is a cross-sectional view illustrating a gate stack array of a semiconductor device according to some example embodiments of the inventive concepts.

FIG. 8 is a cross-sectional view illustrating a gate stack array GSA1 of a semiconductor device according to some example embodiments of the inventive concepts.

Specifically, the gate stack array GSA1 of FIG. 8 may include the first to sixth gate structures GS1 to GS6 of the semiconductor devices SD1 to SD5 described with reference to FIGS. 1 to 7. Seventh and eighth gate structures GS7 and GS8 shown in the gate stack array GSA1 of FIG. 8 may be applied to the semiconductor devices SD1 to SD5 described with reference to FIGS. 1 to 7. The gate stack array GSA1 may be applied to both the planar transistors TR1 to TR4 and the fin-type transistors FTR1 to FTR4 of FIGS. 1 to 7.

More specifically, as described above, a first region I, a second region II, a third region III, and a fourth region IV may be defined in a semiconductor substrate. The first to fourth regions I to IV may be regions for forming first to eighth transistors TR1 to TR8.

The first region I may be a region for forming the first and eighth transistors TR1 and TR8. The second region II may be a region for forming the second and seventh transistors TR2 and TR7. The third region III may be a region for forming the third and sixth transistors TR3 and TR6. The sixth transistor TR6 may correspond to the third transistor TR3-1 of FIG. 3.

The fourth region IV is a region for forming the fourth and fifth transistors TR4 and TR5. The fifth transistor TR5 may correspond to the fourth transistor TR4-1 of FIGS. 2 and 7. The first to fourth regions I to IV may be regions for forming first to eighth fin-type transistors.

The first region I may include the eighth gate structure GS8 and the first gate structure GS1. The second region II may include the seventh gate structure GS7 and the second gate structure GS2. The third region III may include the sixth gate structure GS6 and the third gate structure GS3. The fourth region IV may include the fifth gate structure GS5 and the fourth gate structure GS4.

Hereinafter, the first to eighth gate structures GS1 to GS8 will be described in detail. In the following drawings, material layers are shown as flat for convenience to clearly illustrate gate stack arrays GSA.

First to fourth interface layers 115, 215, 315, and 415 and the first to fourth high dielectric layers 130, 230, 330, and 430 may be arranged on the semiconductor substrate in which the first to fourth regions I to IV are defined. When fin-type transistors are formed, the first to fourth interface layers 115, 215, 315 and 415 and the first to fourth high dielectric layers 130, 230, 330, and 430 may be positioned in trenches (e.g., the first to fourth trenches 112, 212, 312, and 412 of FIG. 4 or 7) on fin-type active regions, as described above. First to fourth high dielectric layers 130a, 230a, 330a, and 430a each including a work function control material may be formed in the fifth, sixth, seventh, and eighth transistors TR5, TR6, TR7, and TR8.

A first work function metal layer 140 is formed on the first high dielectric layers 130 and 130a of the first region I. A third work function metal layer 240 is formed on the second high dielectric layers 230 and 230a of the second region II. A fifth work function metal layer 340 is formed on the third high dielectric layers 330 and 330a of the third region III.

A fourth work function control layer 432 and a fourth capping layer 435 are formed on the fourth high dielectric layer 430a, doped with a work function control material, of the fourth region IV. The fourth capping layer 435 is formed on the fourth high dielectric layer 430 of the fourth region IV. The fourth capping layer 435 may be provided to protect the fourth high dielectric layer 430 during device manufacturing and to enhance reliability during device operation.

A seventh work function metal layer 440 is formed on the fourth capping layer 435 of the fourth region IV. As described above, the first work function metal layer 140, the third work function metal layer 240, the fifth work function metal layer 340, and the seventh work function metal layer 440 may be thickened in this order.

A second work function metal layer 150, a fourth work function metal layer 250, a sixth work function metal layer 350, and an eighth work function metal layer 450 are formed on a first work function metal layer 140, a third work function metal layer 240, a fifth work function metal layer 340, and a seventh work function metal layer 440, respectively. The second work function metal layer 150, the fourth work function metal layer 250, the sixth work function metal layer 350, and the eighth work function metal layer 450 include materials having lower work functions than those of the first work function metal layer 140, the third work function metal layer 240, the fifth work function metal layer 340, and the seventh work function metal layer 440, respectively.

A first gate metal layer 160, a second gate metal layer 260, a third gate metal layer 360, and a fourth gate metal layer 460 are formed on the second work function metal layer 150, the fourth work function metal layer 250, the sixth work function metal layer 350, and the eighth work function metal layer 450, respectively.

In the gate structures GS1 to GS8, a work function control material may be included in the first to fourth high dielectric layers 130, 230, 330, and 430, or the first, third, fifth, and seventh work function metal layer 140, 240, 340, and 440 may have different thicknesses and thus may have different effective work functions. Accordingly, the first to eighth transistors TR1 to TR8 may have different threshold voltages.

The fourth capping layer 435 is formed under the seventh work function metal layer 440 which is the thickest layer among the first, third, fifth, and seventh work function metal layers 140, 240, 340, and 440. The fourth capping layer 435 may protect the fourth high dielectric layers 430 and 430a.

In particular, when the third transistor TR3 and the fourth transistor TR4 are transistors of the first conductivity type, i.e., the P-type, the seventh work function metal layer 440 may have the highest effective work function and the lowest threshold voltage because the seventh work function metal layer 440 has the largest thickness, and thus, a high electric field may be applied to the fourth high dielectric layer 430. Accordingly, when the capping layer 435 is formed on the fourth high dielectric layer 430, the fourth high dielectric layer 430 may be protected and NBTI reliability may be improved.

Figure 9:
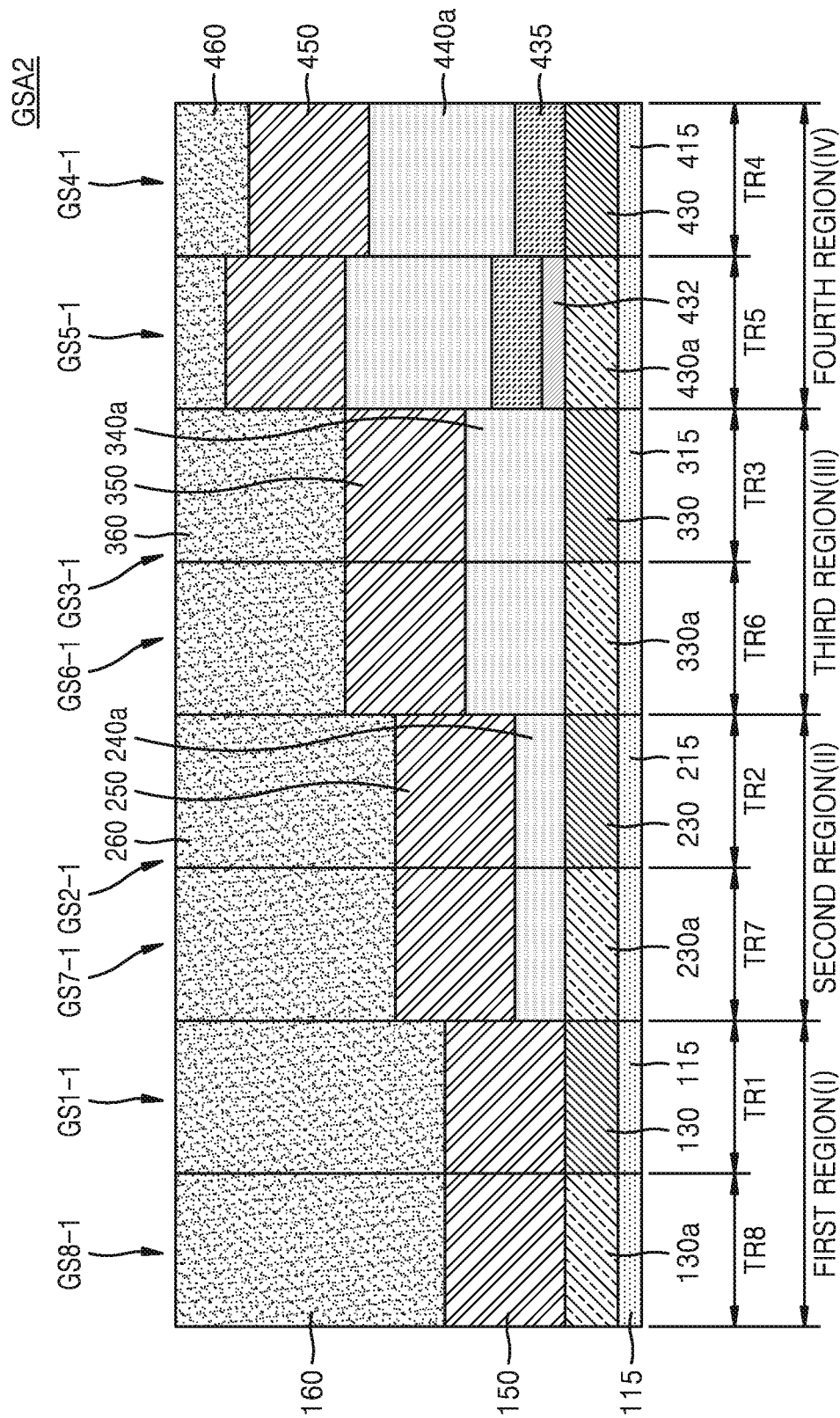
FIG. 9 is a cross-sectional view illustrating a gate stack array of a semiconductor device according to some example embodiments of the inventive concepts.

FIG. 9 is a cross-sectional view illustrating a gate stack array GSA2 of a semiconductor device according to some example embodiments of the inventive concepts.

Specifically, the gate stack array GSA2 of FIG. 9 may be the same as the gate stack array GSA1 of FIG. 8 except that a first work function metal layer is not formed in a first region I and a third work function metal layer 240a, a fifth work function metal layer 340a and a seventh work function metal layer 440a of second to fourth regions II to IV have different thicknesses. In the description of the gate stack array GSA2 of FIG. 9, the same description as that of the gate stack array GSA1 of FIG. 8 are briefly given or omitted.

Unlike in FIG. 8, a first work function metal layer like the first work function metal layer 140 shown in FIG. 8 is not formed in an eighth gate structure GS8-1 and a first gate structure GS1-1 of the first region I. Accordingly, in the eighth gate structure GS8-1 and the first gate structure GS1-1 of the first region I, a second work function metal layer 150 is formed on first high dielectric layers 130 and 130a.

In a seventh gate structure GS7-1 and a second gate structure GS2-1 of the second region II, a third work function metal layer 240a having a small thickness than that of the third work function metal layer 240 of FIG. 8 is formed. In a sixth gate structure GS6-1 and a third gate structure GS3-1 of the third region III, a fifth work function metal layer 340a having a small thickness than that of the fifth work function metal layer 340 of FIG. 8 is formed. In a fifth gate structure GS5-1 and a fourth gate structure GS4-1 of the fourth region IV, a seventh work function metal layer 440a having a small thickness than that of the seventh work function metal layer 440 of FIG. 8 is formed.

Also in the gate stack array GSA2 of FIG. 9, the third work function metal layer 240a, the fifth work function metal layer 340a, and the seventh work function metal layer 440a are thickened in this order. Accordingly, in the gate structures GS1-1 to GS8-1, a plurality of transistors TR1 to TR8 having different effective work functions and accordingly having different threshold voltages may be implemented.

Figure 10:
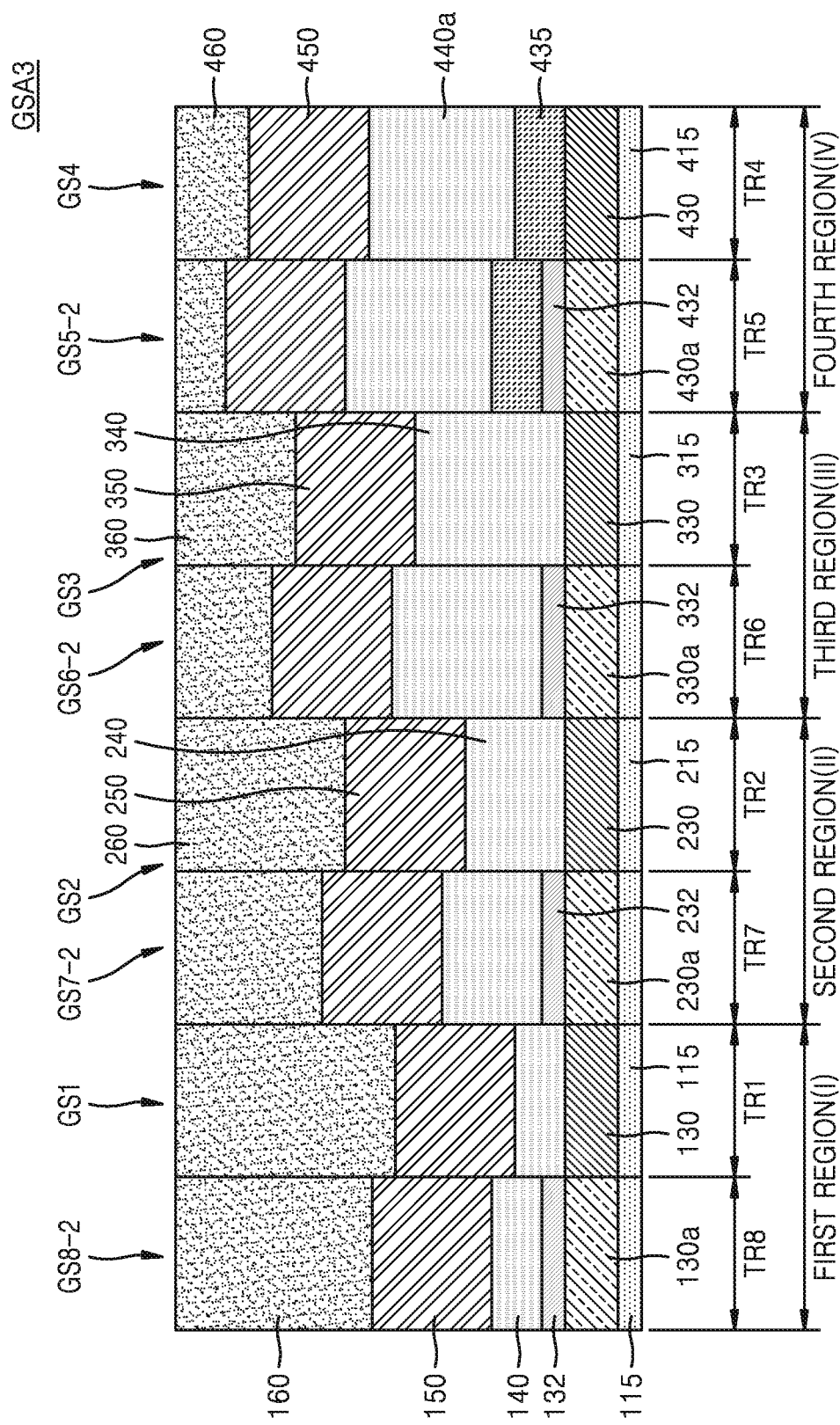
FIG. 10 is a cross-sectional view illustrating a gate stack array of a semiconductor device according to some example embodiments of the inventive concepts.

FIG. 10 is a cross-sectional view illustrating a gate stack array GSA3 of a semiconductor device according to some example embodiments of the inventive concepts.

Specifically, the gate stack array GSA3 of FIG. 10 is the same as the gate stack array GSA1 of FIG. 8 except that first to fourth work function control layers 132, 232, 332, and 432 are formed in an eighth transistor TR8, a seventh transistor TR7, a sixth transistor TR6, and a fifth transistor TR5, respectively, and a seventh work function metal layer 440a has a small thickness. In the description of the gate stack array GSA3 of FIG. 10, the same description as that of the gate stack array GSA1 of FIG. 8 are briefly given or omitted.

The first work function control layer 132, the second work function control layer 232, the third work function control layer 332, and the fourth work function control layer 432 are formed on a first high dielectric layer 130a of an eighth gate structure GS8-2 in a first region I, a second high dielectric layer 230a of a seventh gate structure GS7-2 in a second region II, a third high dielectric layer 330a of a sixth gate structure GS6-2 in a third region III, and a fourth high dielectric layer 430a of a fifth gate structure GS5-2 in a fourth region IV, respectively. In addition, in the fifth gate structure GS5-2 and a fourth gate structure GS4 in the fourth region IV, the seventh work function metal layer 440a having a smaller thickness than the seventh work function metal layer 440 of FIG. 8 is formed.

In gate structures GS1 to GS4 and GS5-2 to GS8-2, a first work function metal layer 140, a third work function metal layer 240, a fifth work function metal layer 340, and a seventh work function metal layer 440 may have different thicknesses and the first to fourth high dielectric layers 130a, 230a, 330a, and 430a may be doped with a work function control material, and thus, a plurality of transistors TR1 to TR8 having different effective work functions and accordingly having different threshold voltages may be implemented.

Figure 11:
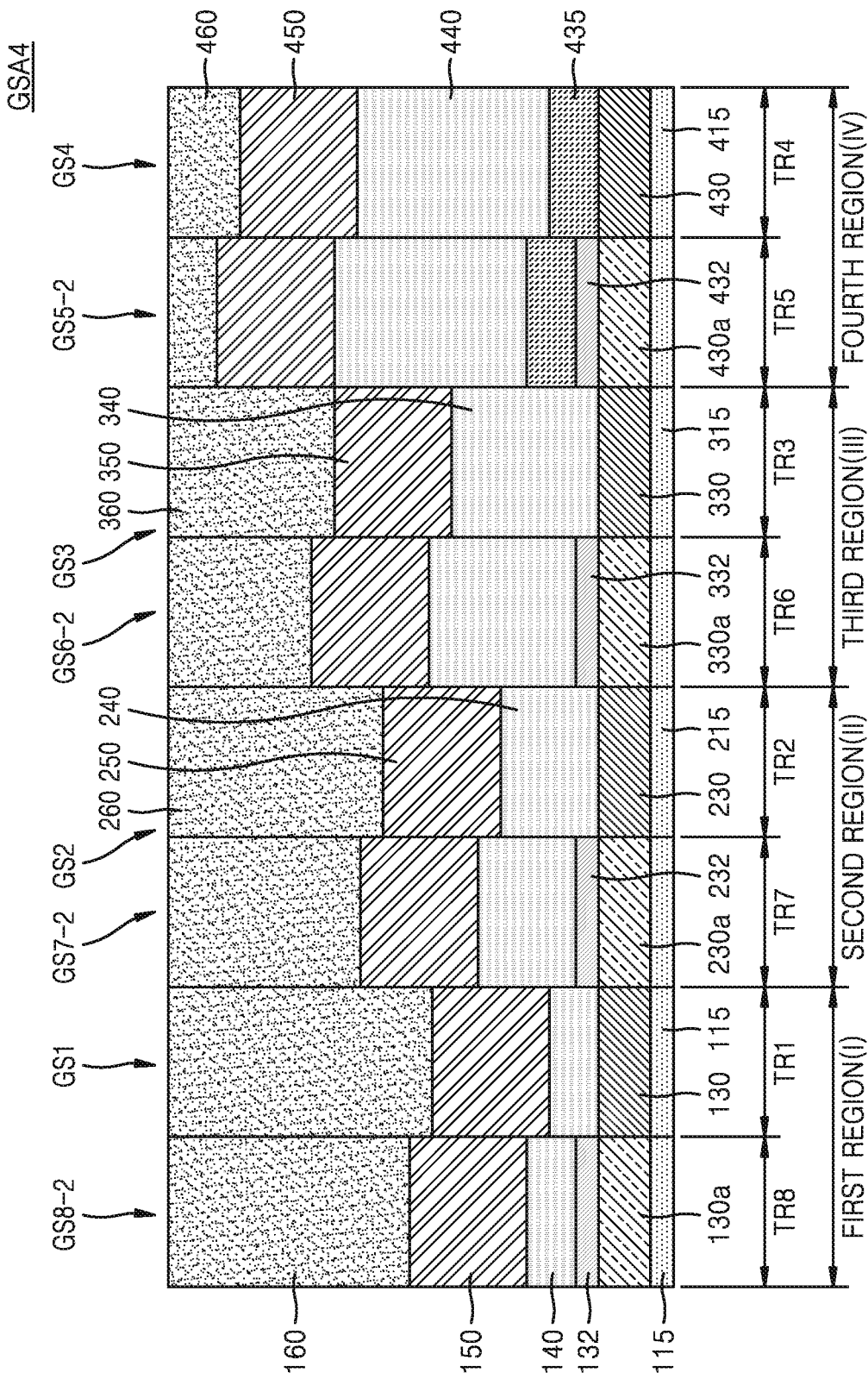
FIG. 11 is a cross-sectional view illustrating a gate stack array of a semiconductor device according to some example embodiments of the inventive concepts.

FIG. 11 is a cross-sectional view illustrating a gate stack array GSA4 of a semiconductor device according to some example embodiments of the inventive concepts.

Specifically, the gate stack array GSA4 of FIG. 11 is the same as the gate stack array GSA1 of FIG. 8 except that first to fourth work function control layers 132, 232, 332, and 432 are formed in an eighth transistor TR8, a seventh transistor TR7, a sixth transistor TR6, and a fifth transistor TR5, respectively. In the description of the gate stack array GSA4 of FIG. 11, the same description as that of the gate stack array GSA1 of FIG. 8 are briefly given or omitted.

The first work function control layer 132, the second work function control layer 232, the third work function control layer 332, and the fourth work function control layer 432 are formed on a first high dielectric layer 130a of an eighth gate structure GS8-2 in a first region I, a second high dielectric layer 230a of a seventh gate structure GS7-2 in a second region II, a third high dielectric layer 330a of a sixth gate structure GS6-2 in a third region III, and a fourth high dielectric layer 430a of a fifth gate structure GS5-2 in a fourth region IV, respectively.

In gate structures GS1 to GS4 and GS5-2 to GS8-2, a first work function metal layer 140, a third work function metal layer 240, a fifth work function metal layer 340, and a seventh work function metal layer 440 may have different thicknesses and the first to fourth high dielectric layers 130a, 230a, 330a, and 430a may be doped with a work function control material, and thus, a plurality of transistors TR1 to TR8 having different effective work functions and accordingly having different threshold voltages may be implemented.

Hereinafter, a method of manufacturing the gate stack array GSA1 of FIG. 8 will be described with reference to FIGS. 12 to 26.

FIGS. 12, 13, 14, 15, 16, 17, 18, 19, 20, and 21 are cross-sectional views illustrating a method of manufacturing a semiconductor device according to some example embodiments of the inventive concepts.

Figure 12:
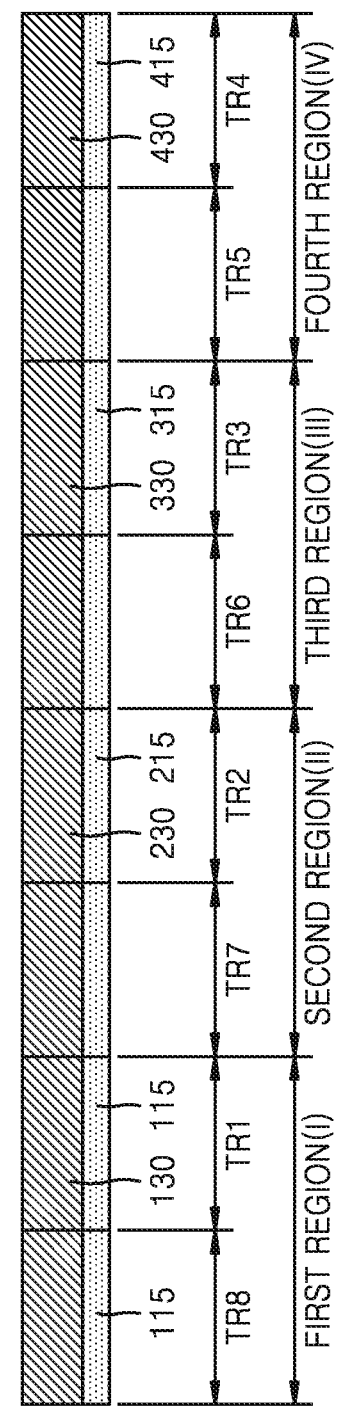
FIGS. 12, 13, 14, 15, 16, 17, 18, 19, 20, and 21 are cross-sectional views illustrating a method of manufacturing a semiconductor device according to some example embodiments of the inventive concepts.

Referring to FIG. 12, a first region I, a second region II, a third region III, and a fourth region IV are defined in a semiconductor substrate. The first to fourth regions I to IV may be regions for forming first to eighth transistors TR1 to TR8. The first to fourth regions I to IV may be regions for forming first to eighth fin-type transistors. Hereinafter, the first to fourth regions I to IV will be described with respect to the first to eighth transistors TR1 to TR8.

The first region I may be a region for forming the first and eighth transistors TR1 and TR8. The second region II may be a region for forming the second and seventh transistors TR2 and TR7. The third region III may be a region for forming the third and sixth transistors TR3 and TR6. The fourth region IV is a region for forming the fourth and fifth transistors TR4 and TR5. The first to fourth regions I to IV may be regions for forming first to eighth fin-type transistors.

First to fourth interface layers 115, 215, 315, and 415 and first to fourth high dielectric layers 130, 230, 330, and 430 are formed on the semiconductor substrate in which the first to fourth regions I to IV are defined. When fin-type transistors are formed, the first to fourth interface layers 115, 215, 315 and 415 and the first to fourth high dielectric layers 130, 230, 330, and 430 may be formed in trenches on fin-type active regions. In the following drawings, material layers are shown as flat for convenience to clearly illustrate gate stack arrays.

Figure 13:
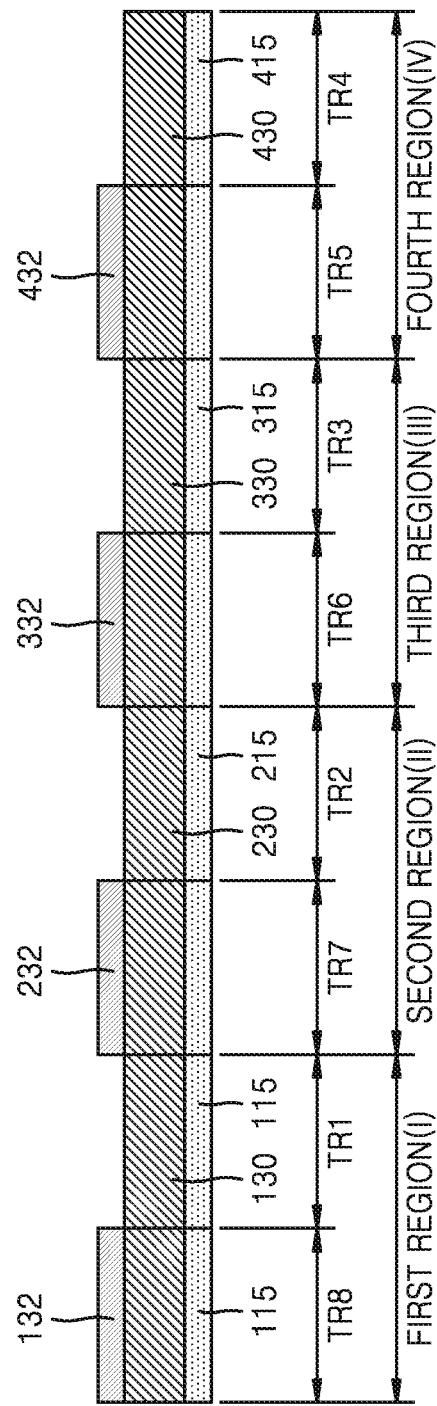

Referring to FIG. 13, first to fourth work function control layers 132, 232, 332, and 432 may be formed in the regions where the eighth, seventh, sixth, and fifth transistors TR8, TR7, TR6, and TR5 are formed. Subsequently, a work function control material may be diffused, by performing annealing, into first to fourth high dielectric layers 130, 230, 330, and 430 in regions in which the fifth, sixth, seventh, and eighth transistors TR5, TR6, TR7, and TR8 are formed.

Figure 14:
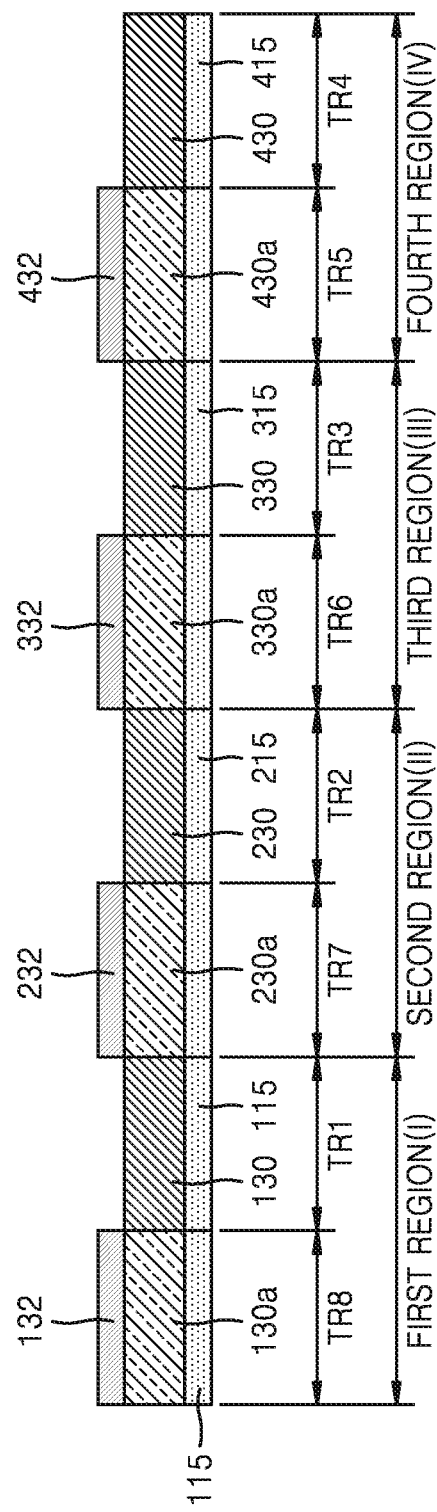

As shown in FIG. 14, first to fourth high dielectric layers 130a, 230a, 330a, and 430a including a work function control material may be formed in the regions where the eighth, seventh, sixth, and fifth transistors TR8, TR7, TR6, and TR5 are formed. The work function control material is not diffused into the first to fourth high dielectric layers 130, 230, 330, and 430 in the regions in which the first, second, third, and fourth transistors TR1, TR2, TR3, and TR4 are formed.

Figure 15:
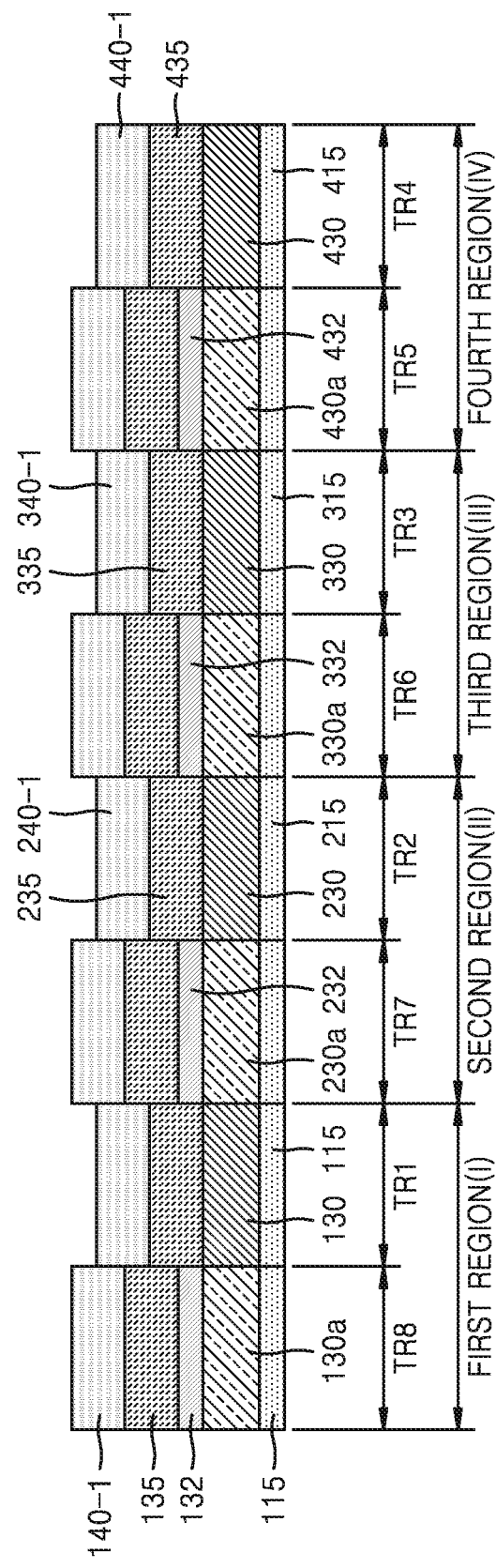

Referring to FIG. 15, first to fourth capping layers 135, 235, 335, and 435 are respectively formed on the first to fourth high dielectric layers 130, 230, 330, and 430 in the regions in which the first, second, third, and fourth transistors TR1, TR2, TR3, and TR4, and the first to fourth work function control layers 132, 232, 332, and 432 in the regions where the eighth, seventh, sixth, and fifth transistors TR8, TR7, TR6, and TR5 are formed.

In other words, the first capping layer 135 is formed on the first high dielectric layer 130 and the first work function control layer 132 of the first and eighth transistors TR1 and TR8 in the first region I. The second capping layer 235 is formed on the second high dielectric layer 230 and the second work function control layer 232 of the second and seventh transistors TR2 and TR7 in the second region II.

The third capping layer 335 is formed on the third high dielectric layer 330 and the third work function control layer 332 of the third and sixth transistors TR3 and TR6 in the third region III. The fourth capping layer 435 is formed on the fourth high dielectric layer 430 and the fourth work function control layer 432 of the fourth and fifth transistors TR4 and TR5 in the fourth region IV.

First to fourth sub work function metal layers 140-1, 240-1, 340-1, and 440-1 are formed on the first to fourth capping layers 135, 235, 335, and 435 in the first to fourth regions I to IV, respectively. In other words, the first to fourth sub work function metal layers 140-1, 240-1, 340-1, and 440-1 are formed on the first to fourth capping layers 135, 235, 335, and 435 in the regions where the first to eighth transistors TR1 to TR8 are formed.

Figure 16:
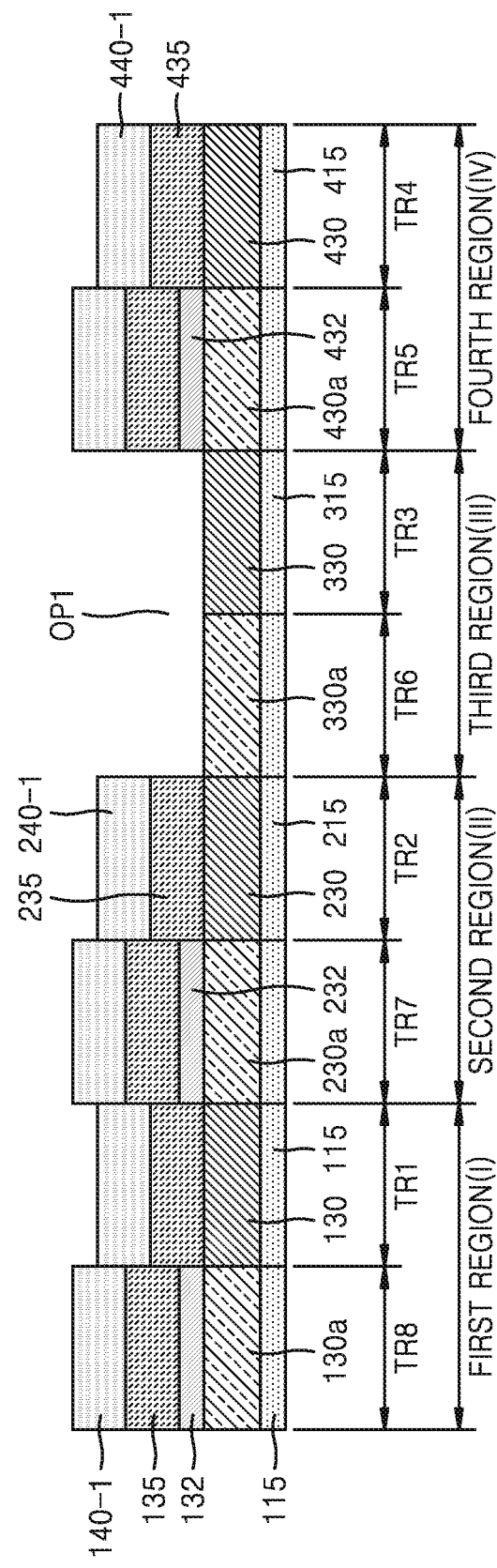

Referring to FIG. 16, the third sub work function metal layer 340-1 and the third capping layer 335 in the third region III are selectively etched to form a first open portion OP1. In other words, the third sub work function metal layer 340-1 and the third capping layer 335 in the third region III are selectively removed using a photolithography process. Accordingly, the surfaces of the third high dielectric layers 330 and 330a in the third region III may be exposed to thereby form the first open portion OP1.

Figure 17:
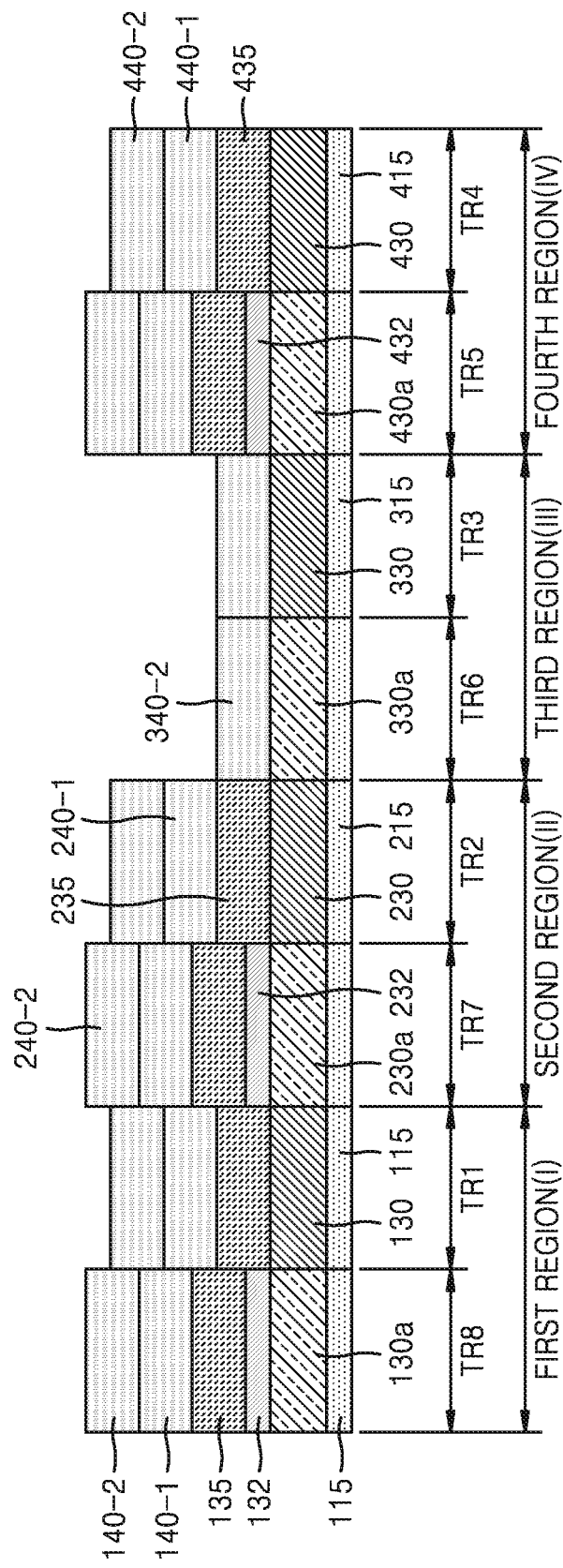

Referring to FIG. 17, fifth to eighth sub work function metal layers 140-2, 240-2, 340-2, and 440-2 are respectively formed on the first sub work function metal layer 140-1 in the first region I, the second sub work function metal layer 240-1 in the second region II, the third high dielectric layers 330 and 330a in the third region III, and the fourth sub work function metal layer 440-1 in the fourth region IV.

Figure 18:
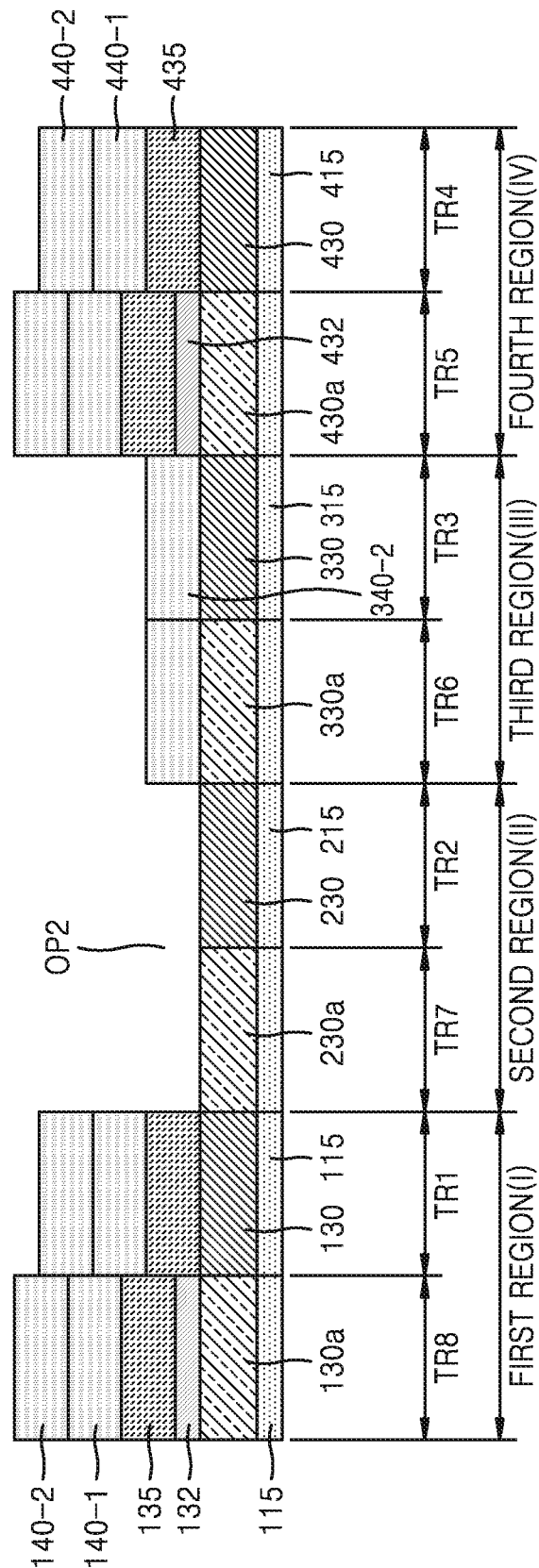

Referring to FIG. 18, the sixth sub work function metal layer 240-2, the second sub work function metal layer 240-1, and the second capping layer 235 in the second region II are selectively etched to form a second open portion OP2. In other words, the sixth sub work function metal layer 240-2, the second sub work function metal layer 240-1, and the second capping layer 235 in the second region II are selectively removed using a photolithography process. Accordingly, the surfaces of the second high dielectric layers 230 and 230a in the second region II may be exposed to thereby form the second open portion OP2.

Figure 19:
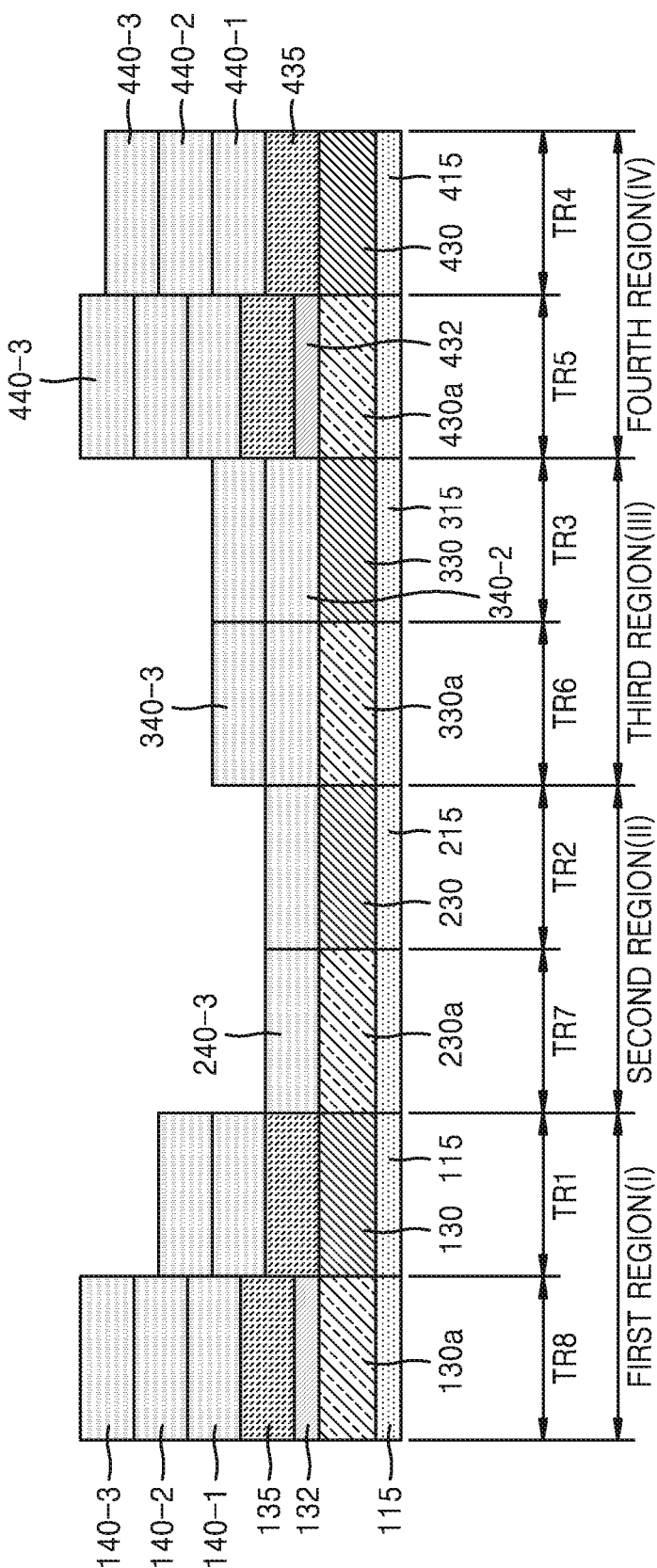

Referring to FIG. 19, ninth to twelfth sub work function metal layers 140-3, 240-3, 340-3, and 440-3 are respectively formed on the fifth sub work function metal layer 140-2 in the first region I, the second high dielectric layers 230 and 230a in the second region II, the seventh sub work function metal layer 340-2 in the third region III, and the eighth sub work function metal layer 440-2 in the fourth region IV.

Figure 20:
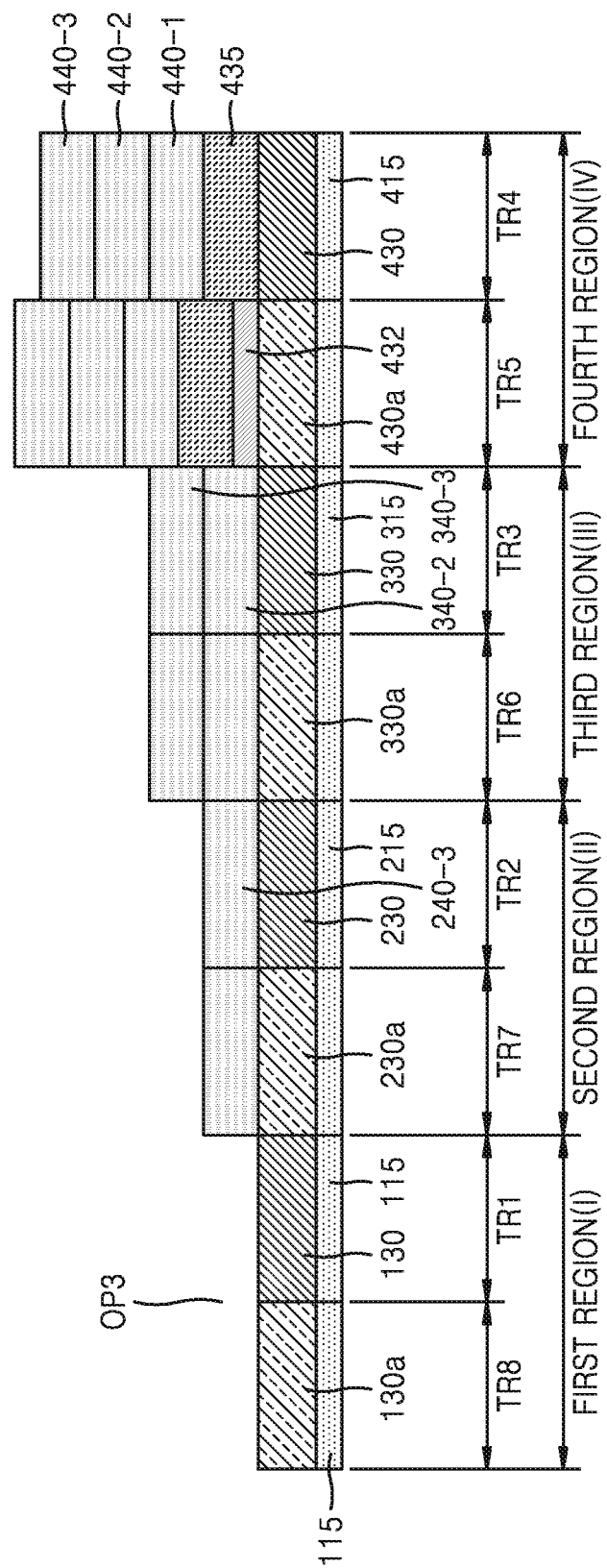

Referring to FIG. 20, the ninth sub work function metal layer 140-3, the fifth sub work function metal layer 140-2, the first sub work function metal layer 140-1, the first capping layer 135, and the first work function control layer 132 in the first region I are selectively etched to form a third open portion OP3.

In other words, the ninth sub work function metal layer 140-3, the fifth sub work function metal layer 140-2, the first sub work function metal layer 140-1, the first capping layer 135, and the first work function control layer 132 in the first region I are selectively removed using a photolithography process. Accordingly, the surfaces of the first high dielectric layers 130 and 130a in the first region I may be exposed to thereby form the third open portion OP3.

Figure 21:
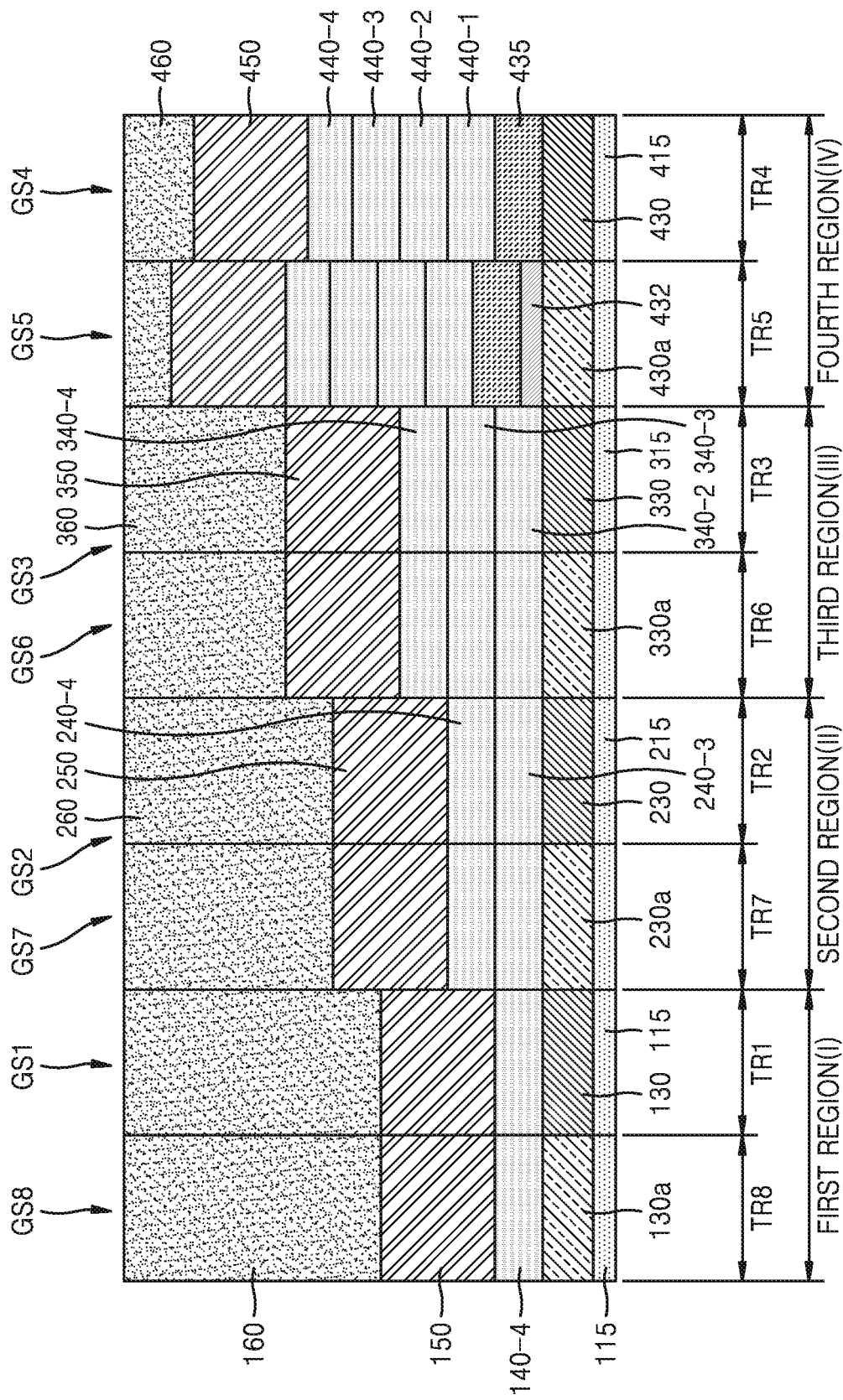

Referring to FIG. 21, thirteenth to sixteenth sub work function metal layers 140-4, 240-4, 340-4, and 440-4 are respectively formed on the first high dielectric layers 130 and 130a in the first region I, the tenth sub work function metal layer 240-3 in the second region II, the eleventh sub work function metal layer 340-3 in the third region III, and the twelfth sub work function metal layer 440-3 in the fourth region IV.

Accordingly, the thirteenth sub work function metal layer 140-4 in the first region I may be the first work function metal layer 140 of FIG. 8. The tenth and fourteenth sub work function metal layers 240-3 and 240-4 in the second region II may be the third work function metal layer 240 of FIG. 8. The seventh sub work function metal layer 340-2, the eleventh sub work function metal layer 340-3, and the fifteenth sub work function metal layer 340-4 in the third region III may be the fifth work function metal layer 340 of FIG. 8. The fourth sub work function metal layer 440-1, the eighth sub work function metal layer 440-2, the twelfth sub work function metal layer 440-3, and the sixteenth sub work function metal layer 440-4 may be the seventh work function metal layer 440 of FIG. 8.

Subsequently, a second work function metal layer 150, a fourth work function metal layer 250, a sixth work function metal layer 350, and an eighth work function metal layer 450 are formed on the thirteenth to sixteenth sub work function metal layers 140-4, 240-4, 340-4, and 440-4, respectively. Next, first to fourth gate metal layers 160, 260, 360, and 460 are formed on the second work function metal layer 150, the fourth work function metal layer 250, the sixth work function metal layer 350, and the eighth work function metal layer 450, respectively, thereby forming gate structures GS1 to GS8.

FIGS. 22, 23, 24, 25, and 26 are cross-sectional views illustrating a method of manufacturing a semiconductor device according to some example embodiments of the inventive concepts.

Figure 22:
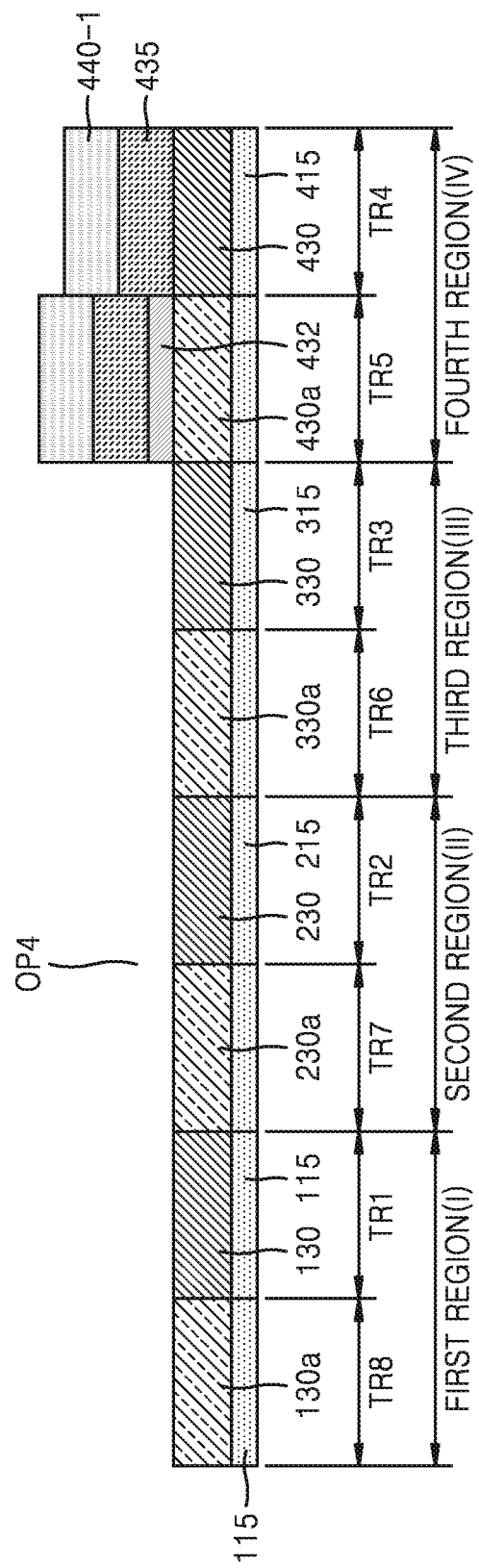
FIGS. 22, 23, 24, 25, and 26 are cross-sectional views illustrating a method of manufacturing a semiconductor device according to some example embodiments of the inventive concepts.

Specifically, the processes of FIG. 12 to FIG. 15 are performed, and then the processes of FIGS. 22 to 26 are performed. Referring to FIG. 22, the first sub work function metal layer 140-1, the first capping layer 135, and the first work function control layer 132 in the first region I, the second sub work function metal layer 240-1, the second capping layer 235, and the second work function control layer 232 in the second region II, and the third sub work function metal layer 340-1, the third capping layer 335, and the third work function control layer 332 in the third region III are selectively etched to form a fourth open portion OP4.

In other words, the first sub work function metal layer 140-1, the first capping layer 135, and the first work function control layer 132 in the first region I, the second sub work function metal layer 240-1, the second capping layer 235, and the second work function control layer 232 in the second region II, and the third sub work function metal layer 340-1, the third capping layer 335, and the third work function control layer 332 in the third region III are selectively removed using a photolithography process. Accordingly, the surfaces of the first high dielectric layers 130 and 130a in the first region I, the surfaces of the second high dielectric layers 230 and 230a in the second region II, and the surfaces of the third high dielectric layers 330 and 330a in the third region III may be exposed to thereby form the fourth open portion OP4.

Figure 23:
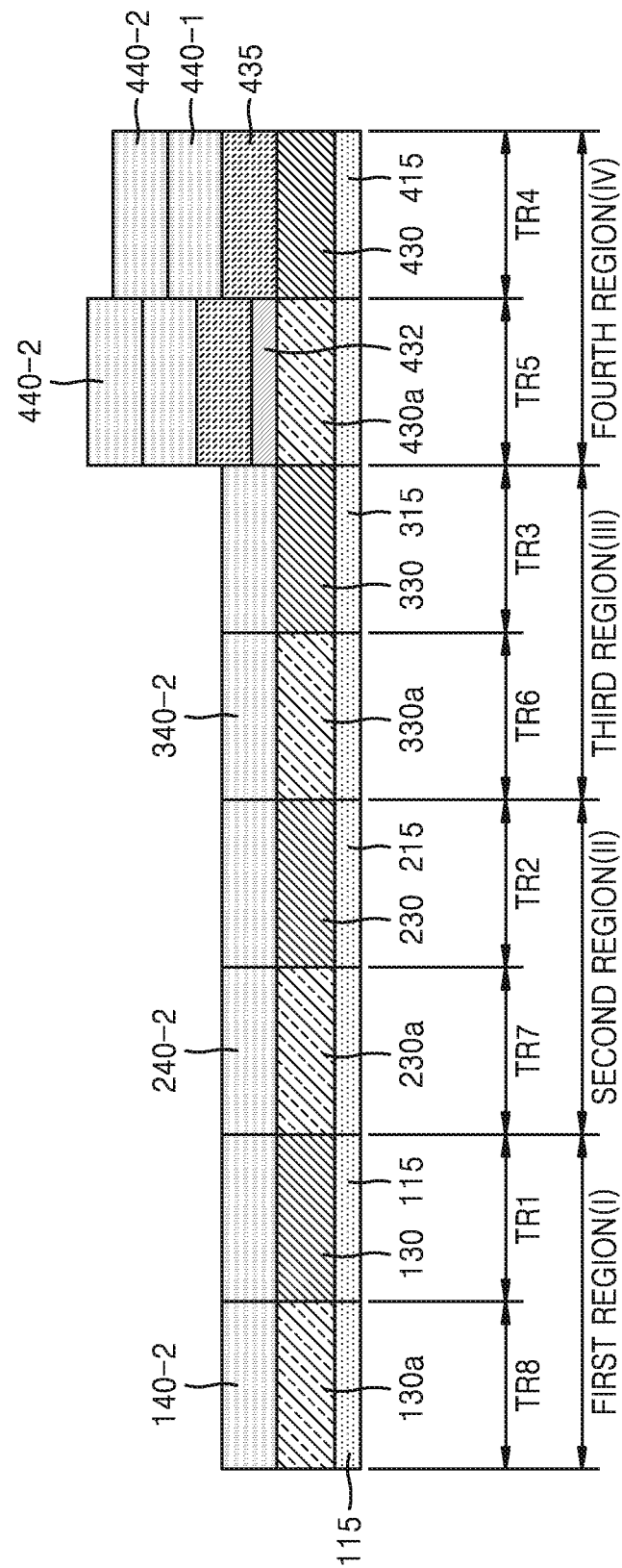

Referring to FIG. 23, fifth to eighth sub work function metal layers 140-2, 240-2, 340-2, and 440-2 are respectively formed on first high dielectric layers 130 and 130a in a first region I, second high dielectric layers 230 and 230a in a second region II, third high dielectric layers 330 and 330a in a third region III, and a fourth sub work function metal layer 440-1 in a fourth region IV.

Figure 24:
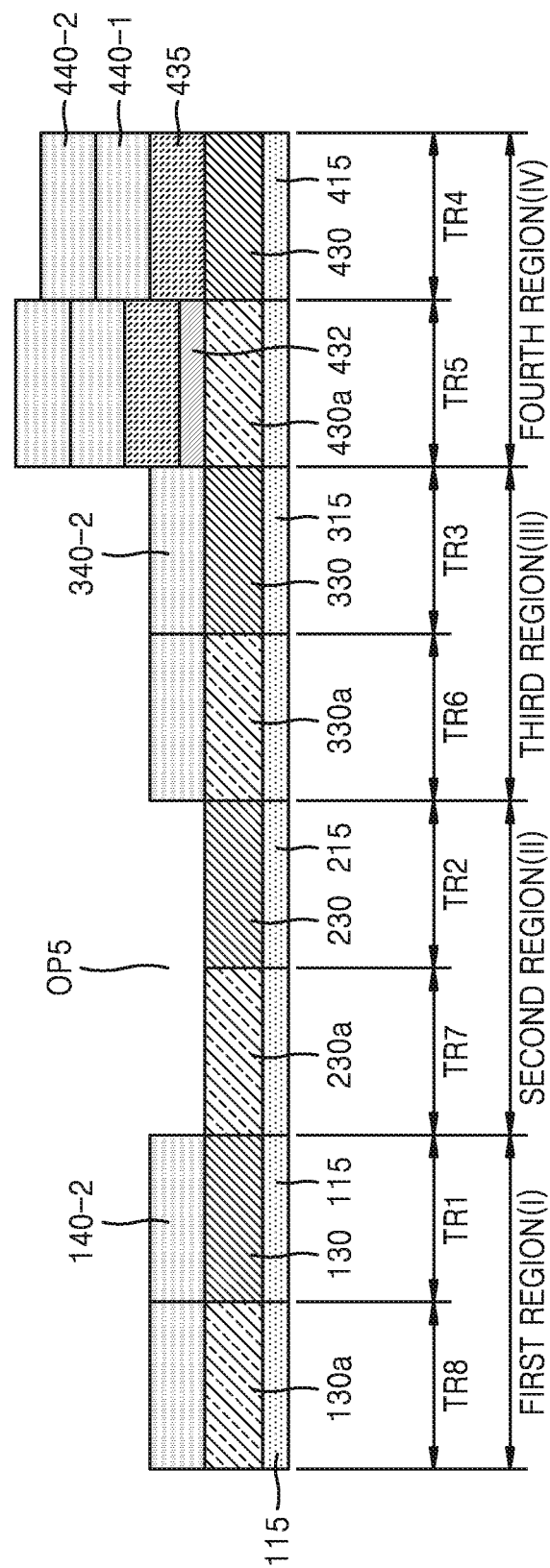

Referring to FIG. 24, the sixth sub work function metal layer 240-2 in the second region II is selectively etched to form a fifth open portion OP5. In other words, the sixth sub work function metal layer 240-2 in the second region II is selectively removed using a photolithography process. Accordingly, the surfaces of the second high dielectric layers 230 and 230a in the second region II may be exposed to thereby form the fifth open portion OP5.

Figure 25:
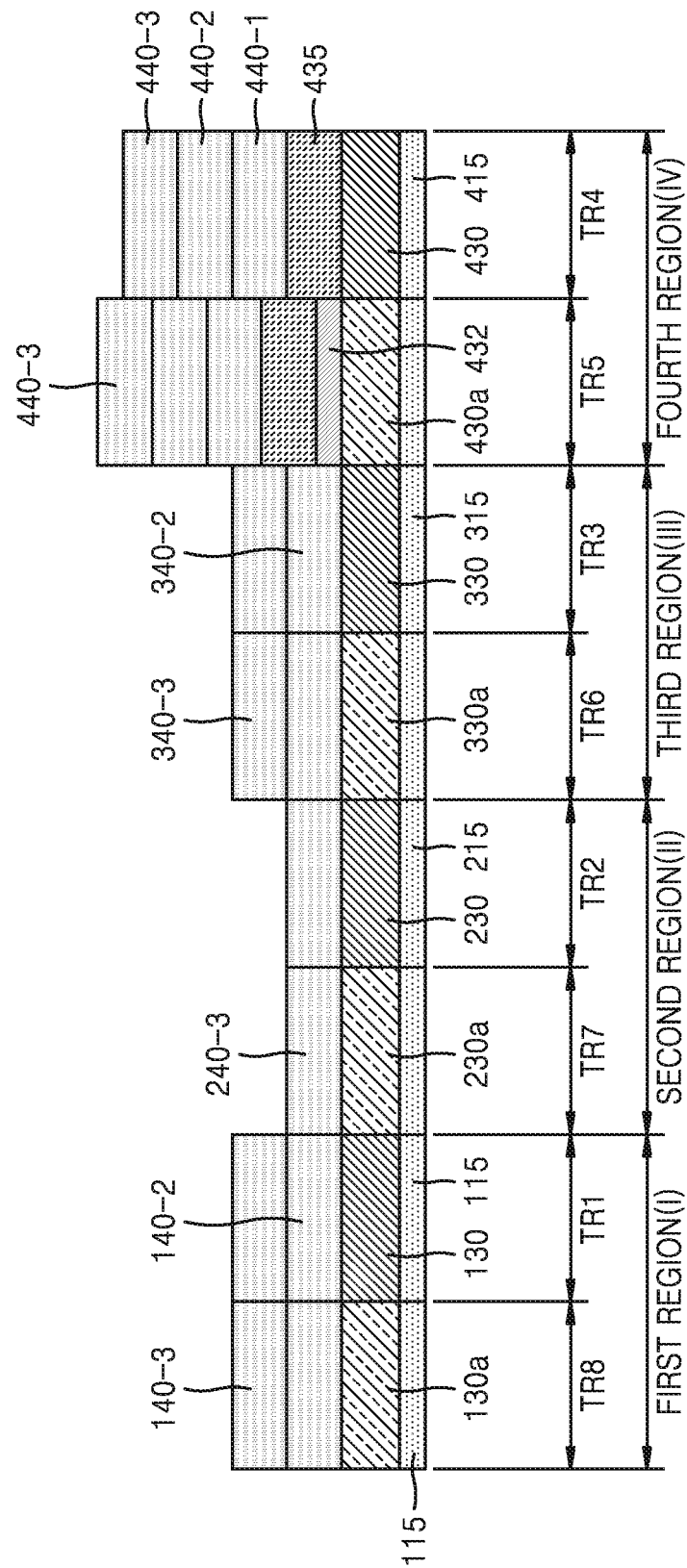

Referring to FIG. 25, ninth to twelfth sub work function metal layers 140-3, 240-3, 340-3, and 440-3 are respectively formed on the fifth sub work function metal layer 140-2 in the first region I, the second high dielectric layers 230 and 230a in the second region II, the seventh sub work function metal layer 340-2 in the third region III, and the eighth sub work function metal layer 440-2 in the fourth region IV.

Figure 26:
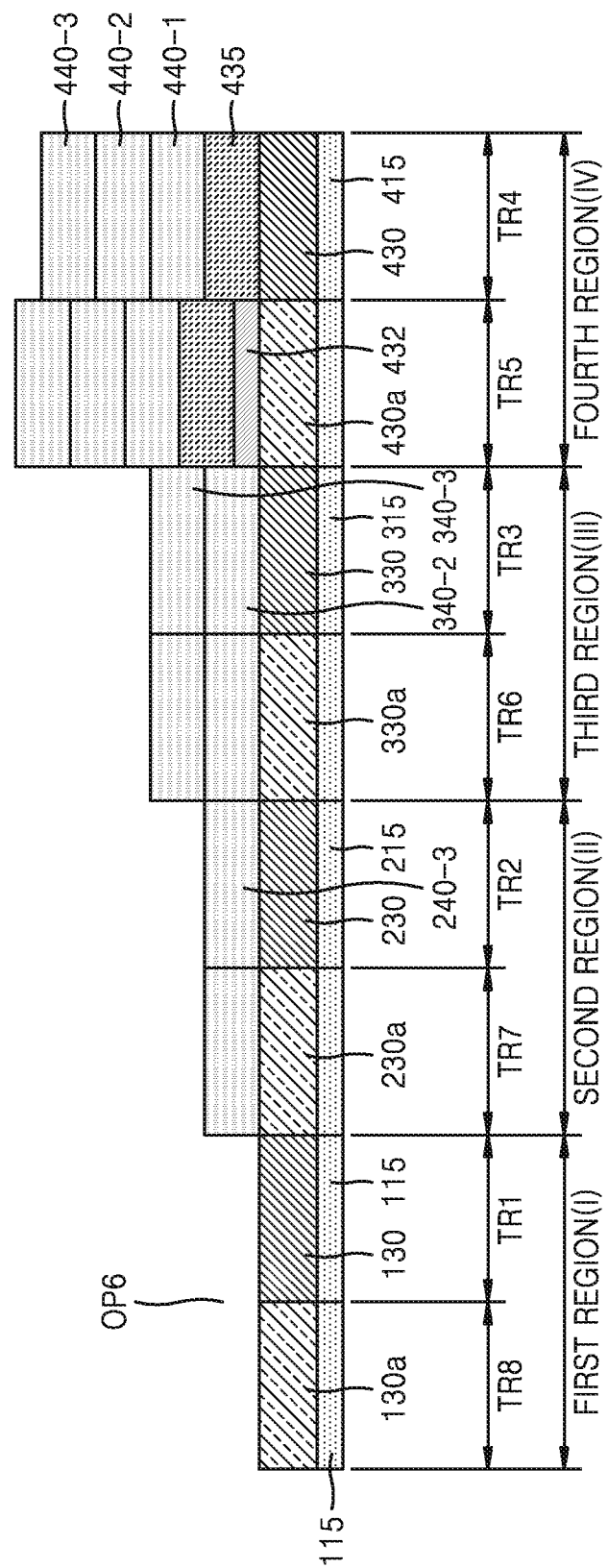

Referring to FIG. 26, the ninth sub work function metal layer 140-3 and the fifth sub work function metal layer 140-2 in the first region I are selectively etched to form a sixth open portion OP6. In other words, the ninth sub work function metal layer 140-3 and the fifth sub work function metal layer 140-2 in the first region I are selectively removed using a photolithography process. Accordingly, the surfaces of the first high dielectric layers 130 and 130a in the first region I may be exposed to thereby form the sixth open portion OP6.

Next, as described with reference to FIG. 21, thirteenth to sixteenth sub work function metal layers 140-4, 240-4, 340-4, and 440-4 are respectively formed on the first high dielectric layers 130 and 130a in the first region I, the tenth sub work function metal layer 240-3 in the second region II, the eleventh sub work function metal layer 340-3 in the third region III, and the twelfth sub work function metal layer 440-3 in the fourth region IV. As a result, as shown in FIG. 8, a first work function metal layer 140, a third work function metal layer 240, a fifth work function metal layer 340, and a seventh work function metal layer 440 are formed in the first region I, the second region II, the third region III, and the fourth region IV, respectively.

Subsequently, as shown in FIG. 21, a second work function metal layer 150, a fourth work function metal layer 250, a sixth work function metal layer 350, and an eighth work function metal layer 450 are formed. Next, first to fourth gate metal layers 160, 260, 360, and 460 are formed on the second work function metal layer 150, the fourth work function metal layer 250, the sixth work function metal layer 350, and the eighth work function metal layer 450, respectively, thereby forming gate structures GS1 to GS8.

As described above, a semiconductor device according to some example embodiments of the inventive concepts includes a plurality of gate structures on a substrate and further includes a capping layer containing impurities, e.g., silicon elements, on a high dielectric layer in a gate structure having a high work function. Accordingly, the semiconductor device according to some example embodiments of the inventive concepts includes gate structures having different work functions, which are formed without the influence of manufacturing processes, such as a photolithography process or a heat treatment process in forming the gate structures, and thus may have a multi-threshold voltage.

While the inventive concepts has been particularly shown and described with reference to embodiments thereof, it will be understood that various changes in form and details may be made therein without departing from the spirit and scope of the following claims.

What is claimed is:

1. A semiconductor device, comprising:
a plurality of active regions on a semiconductor substrate;
a plurality of gate structures on separate, respective active regions of the plurality of active regions, each separate gate structure of the plurality of gate structures including a sequential stack of
a high dielectric layer,
a first work function metal layer,
a second work function metal layer having a lower work function than the first work function metal layer, and
a gate metal layer; and
a plurality of source/drain regions in the semiconductor substrate, the plurality of source/drain regions on opposite sides of separate, respective gate structures of the plurality of gate structures,
wherein the first work function metal layers of the plurality of gate structures have different thicknesses, such that the plurality of gate structures includes a largest gate structure, the first work function metal layer of the largest gate structure having a largest thickness of the first work function metal layers of the plurality of gate structures, and
wherein the largest gate structure further includes a capping layer on the high dielectric layer of the largest gate structure, the capping layer including one or more impurity elements.

2. The semiconductor device of claim 1, wherein the plurality of active regions are planar active regions.

3. The semiconductor device of claim 1, wherein the plurality of active regions include a plurality of fin-type active regions.

4. The semiconductor device of claim 3, wherein the plurality of gate structures are in separate, respective trenches on separate, respective fin-type active regions of the plurality of fin-type active regions.

5. The semiconductor device of claim 1, wherein the plurality of gate structures further includes an interface layer between the semiconductor substrate and the high dielectric layers of the plurality of gate structures.

6. The semiconductor device of claim 1, wherein the capping layer includes a metal layer, the metal layer including one or more silicon elements.

7. The semiconductor device of claim 6, wherein the plurality of gate structures further includes a work function control layer between the capping layer and the high dielectric layer of the largest gate structure.

8. The semiconductor device of claim 1, wherein the high dielectric layer of the largest gate structure has a lower nitrogen concentration than a remainder of high dielectric layers of the plurality of gate structures.

9. The semiconductor device of claim 1, wherein at least one high dielectric layer of the high dielectric layers of the plurality of gate structures includes a work function control material.

10. The semiconductor device of claim 1, wherein,
a limited portion of the plurality of gate structures that excludes the largest gate structure are of a first conductivity type based on a limited portion of source/drain regions corresponding to the limited portion of the plurality of gate structures being of the first conductivity type, and
the largest gate structure is of a second conductivity type opposite to the first conductivity type based on a source/drain region corresponding to the largest gate structure being of the second conductivity type.

11. A semiconductor device, comprising:
a semiconductor substrate including first to third active regions;
a first gate structure on the first active region, the first gate structure including a sequential stack of
a first high dielectric layer,
a first work function metal layer,
a second work function metal layer having a lower work function than the first work function metal layer, and
a first gate metal layer;
a second gate structure on the second active region, the second gate structure including a sequential stack of
a second high dielectric layer having a common material as the first high dielectric layer,
a third work function metal layer having a common material as the first work function metal layer and having a larger thickness than the first work function metal layer,
a fourth work function metal layer having a common material as the second work function metal layer, and
a second gate metal layer;
a third gate structure on the third active region, the third gate structure including a sequential stack of
a third high dielectric layer having a common material as the second high dielectric layer,
a capping layer including one or more impurity elements,
a fifth work function metal layer having a common material as the third work function metal layer and having a larger thickness than the third work function metal layer,
a sixth work function metal layer having a common material as the fourth work function metal layer, and
a third gate metal layer; and
a plurality of source/drain regions in the semiconductor substrate, the plurality of source/drain regions on opposite sides of separate, respective gate structures of the first to third gate structures.

12. The semiconductor device of claim 11, wherein the first to third active regions are a plurality of fm-type active regions, and the first to third gate structures are in separate, respective trenches on separate, respective fin-type active regions of the plurality of fin-type active regions.

13. The semiconductor device of claim 11, wherein the capping layer is a metal layer, the metal layer including one or more silicon elements, the metal layer including a common metal as the fifth work function metal layer.

14. The semiconductor device of claim 11, wherein the third gate structure further includes a work function control layer between the capping layer and the third high dielectric layer.

15. The semiconductor device of claim 11, wherein the third high dielectric layer has a lower nitrogen concentration than the first and second high dielectric layers.

16. The semiconductor device of claim 11, wherein,
the first and second gate structures are of a first conductivity type based on source/drain regions corresponding to the first and second gate structures being of the first conductivity type, and
the third gate structure is of a second conductivity type opposite to the first conductivity type based on source/drain regions corresponding to the third gate structure being of the second conductivity type.

17. A semiconductor device, comprising:
a first transistor including
- a first fin-type active region,
- a first trench on the first fin-type active region,
- a first high dielectric layer on an inner wall of the first trench,
- a first work function metal layer on the first high dielectric layer in the first trench, and
- a second work function metal layer on the first work function metal layer and having a lower work function than the first work function metal layer;

a second transistor including
- a second fin-type active region,
- a second trench on the second fin-type active region,
- a second high dielectric layer on an inner wall of the second trench,
- a third work function metal layer on the second high dielectric layer in the second trench and having a larger thickness than the first work function metal layer, and
- a fourth work function metal layer on the third work function metal layer and having a lower work function than the third work function metal layer; and a third transistor including
- a third fin-type active region,
- a third trench on the third fin-type active region,
- a third high dielectric layer along an inner wall of the third trench,
- a capping layer on the third high dielectric layer in the third trench and comprising impurity elements,
- a fifth work function metal layer on the capping layer and having a larger thickness than the third work function metal layer, and
- a sixth work function metal layer on the fifth work function metal layer and having a lower work function than the fifth work function metal layer.

18. The semiconductor device of claim 17, wherein the capping layer is a metal layer, the metal layer including one or more silicon elements, the metal layer including a common metal as the fifth work function metal layer.

19. The semiconductor device of claim 17, wherein at least one high dielectric layer of the first to third high dielectric layers includes a work function control material.

20. The semiconductor device of claim 17, wherein
the first and second transistors are metal-oxide semiconductor (MOS) transistors of a first conductivity type, and
the third transistor is a MOS transistor of a second conductivity type opposite to the first conductivity type.

* * * * *